(12) United States Patent
Ding et al.

(10) Patent No.: US 12,191,410 B2
(45) Date of Patent: Jan. 7, 2025

(54) MULTIJUNCTION SOLAR CELLS AND MULTICOLOR PHOTODETECTORS HAVING AN INTEGRATED EDGE FILTER

(71) Applicant: Cactus Materials, Inc., Tempe, AZ (US)

(72) Inventors: Ding Ding, Chandler, AZ (US); Philip Dowd, Gilbert, AZ (US)

(73) Assignee: Cactus Materials, Inc., Tempe, AZ (US)

( * ) Notice: Subject to any disclaimer, the term of this patent is extended or adjusted under 35 U.S.C. 154(b) by 762 days.

(21) Appl. No.: 17/272,147

(22) PCT Filed: Aug. 28, 2019

(86) PCT No.: PCT/US2019/048533
§ 371 (c)(1),
(2) Date: Feb. 26, 2021

(87) PCT Pub. No.: WO2020/047069
PCT Pub. Date: Mar. 5, 2020

(65) Prior Publication Data
US 2021/0328082 A1    Oct. 21, 2021

Related U.S. Application Data

(60) Provisional application No. 62/725,047, filed on Aug. 30, 2018.

(51) Int. Cl.
*H01L 31/0232* (2014.01)
*H01L 31/0304* (2006.01)
(Continued)

(52) U.S. Cl.
CPC .. *H01L 31/02327* (2013.01); *H01L 31/03048* (2013.01); *H01L 31/0547* (2014.12); *H01L 31/06875* (2013.01)

(58) Field of Classification Search
CPC ......... H01L 31/02327; H01L 31/03048; H01L 31/054; H01L 31/0687
(Continued)

(56) References Cited

U.S. PATENT DOCUMENTS 9,018,521 B1 *   4/2015 Cornfeld ............. H01L 31/0547
                                                136/262
2009/0159123 A1 * 6/2009 Kothari ................. H01L 31/076
                                                136/256
(Continued)

FOREIGN PATENT DOCUMENTS

DE          4004398 A1 *   8/1991   ......... H01L 31/1055
WO       2017066473 A1     4/2017

OTHER PUBLICATIONS

P. Sah and B. K. Das, "Integrated Optical Rectangular-Edge Filter Devices in SOI," in Journal of Lightwave Technology, vol. 35, No. 2, pp. 128-135, 15, Jan. 15, 2017, doi: 10.1109/JLT.2016.2625838. (Year: 2016).*

Edmund. (Feb. 1, 2001). "Dichroic Longpass Filters," Edmund Optics Worldwide, Product Catalogue, retrieved Dec. 11, 2019 from the Internet: URL:https://www.edmundoptics.com/f/dichroic-longpa{s-filters/14288/ ; see entire document.

(Continued)

*Primary Examiner* — Matthew E. Gordon
(74) *Attorney, Agent, or Firm* — LOZA & LOZA, LLP; David S. Sarisky

(57) ABSTRACT

Semiconductor devices comprising a semiconductor edge filter, a first light absorbing region overlying the semiconductor edge filter and a second light absorbing region underlying the semiconductor edge filter are disclosed. The semiconductor edge filter has a high reflectivity over a first wavelength range absorbed by the overlying light absorbing region and a high transmission over a second wavelength range absorbed by the underlying light absorbing region.

16 Claims, 11 Drawing Sheets

(51) Int. Cl.
*H01L 31/054* (2014.01)
*H01L 31/0687* (2012.01)

(58) Field of Classification Search
USPC .......................................................... 257/432
See application file for complete search history.

(56) References Cited

U.S. PATENT DOCUMENTS

| | | | |
|---|---|---|---|
| 2010/0147366 A1* | 6/2010 | Stan .................... | H01L 31/0547 |
| | | | 257/E31.127 |
| 2017/0062642 A1* | 3/2017 | Pantha ................ | H01L 31/0547 |
| 2017/0200845 A1* | 7/2017 | King ................... | H01L 31/0687 |

OTHER PUBLICATIONS

Magden, E. S., et al. (Aug. 1, 2018). "Transmissive silicon photonic dichroic filters with spectrally selective waveguides," Nature Communications, retrieved Nov. 25, 2019, from the Internet: URL:https://www.nature.com/articles/s41467-018-05287-1, see entire document.

Thorlabs. (Sep. 29, 2008). "Longpass Dichroic Mirrors/Beamsplitters," Product Description, retrieved Nov. 25, 2019, from the Internet: URL:https://www.thorlabs.com/newgrouppage9.cfm?objectgroup_id=3313 ; image in box 1 on p. 15; p. 2; wavelength specifications table on p. 4.

* cited by examiner

| Layer Composition | Layer Function |
|---|---|
| InGaAs | InGaAs Contact |
| InAlP | FSF (Front Surface Field) |
| AlGaInP | Emitter |
| AlGaInP | Base |
| AlGaInP | BSF (Back Surface Field) |
| AlGaAs | Tunnel Junction |
| GaAs | Tunnel Junction |
| AlGaInP | FSF (Front Surface Field) |
| AlGaAs | Emitter |
| AlGaAs | Base |
| AlGaAs | BSF (Back Surface Field) |
| InGaAs | Tunnel Junction |
| InGaAs | Tunnel Junction |
| InGaAs | Emitter |
| GaInNAsSb | Base |
| GaInNAsSb | Base |
| InGaAs | BSF (Back Surface Field) |
| InGaAs | Tunnel Junction |
| InGaAs | Tunnel Junction |
| GaAs/AlGaAs | Edge Filter |
| GaAs | Buffer Layer |
| InGaP, InAlP and/or AlP | III-V Barrier/Nucleation |
| (Se, Sn) Ge | Substrate, Base |

FIG. 6

| Layer Composition | Layer Function |
|---|---|
| InGaAs | InGaAs Contact |
| InAlP | FSF (Front Surface Field) |
| AlGaInP | Emitter |
| AlGaInP | Base |
| AlGaInP | BSF (Back Surface Field) |
| AlGaAs | Tunnel Junction |
| GaAs | Tunnel Junction |
| AlGaInP | FSF (Front Surface Field) |
| AlGaAs | Emitter |
| AlGaAs | Base |
| AlGaAs | BSF (Back Surface Field) |
| InGaAs | Tunnel Junction |
| InGaAs | Tunnel Junction |
| InGaAs | Emitter |
| GaInNAsSb | Base |
| GaInNAsSb | Base |
| InGaAs | BSF (Back Surface Field) |
| InGaAs | Tunnel Junction |
| InGaAs | Tunnel Junction |
| GaAs/AlGaAs | Edge Filter |
| AlGaAsSb | Graded Buffer Layer |
| GaSb | Substrate & Junction |

FIG. 7

MULTIJUNCTION SOLAR CELLS AND MULTICOLOR PHOTODETECTORS HAVING AN INTEGRATED EDGE FILTER

CROSS REFERENCE TO RELATED APPLICATIONS

This application is a national stage application under 35 U.S.C. § 371 of International Application No. PCT/US2019/048533, filed internationally on Aug. 28, 2019, which claims the benefit of U.S. Provisional Application No. 62/725,047, filed on Aug. 30, 2018, the contents of which are incorporated herein by reference in its entirety for all purposes.

FIELD

The present invention relates to semiconductor light absorption devices having a semiconductor edge filter, and in particular, light absorption devices having a semiconductor edge filter disposed beneath a first light absorbing layer and overlying a second light absorbing layer. The semiconductor edge filter provides a broad high reflectivity bandwidth below a design wavelength, so as to provide increased absorption within an overlying light absorbing layer and a very low reflectivity above the design wavelength such that the semiconductor edge filter minimizes the impact of transmitted light into an underlying light absorbing region.

BACKGROUND

Multijunction solar cells based primarily compound on III-V compound semiconductor materials are known to produce the highest efficiency cells, making them highly suited to terrestrial applications such as concentrating photovoltaic (CPV) systems, and space applications. Multijunction solar cells (100), as shown in FIGS. 1 and 2A-D, include multiple diodes in series connection, known in the art as junctions or subcells (106, 107 and 108 in FIG. 1), realized by growing thin regions of epitaxy in stacks on semiconductor substrates. Each junction in a stack possesses a unique band gap and is optimized for absorbing a different portion of the solar spectrum, thereby improving efficiency of solar energy conversion. These junctions can be chosen from a variety of semiconductor materials with different optical and electrical properties to absorb different portions of the solar spectrum. The materials are arranged such that the band gaps of the junctions become progressively lower from the top junction (106) to the bottom junction (108). Thus, high-energy photons are absorbed in the top junction and less energetic photons pass through to the lower junctions where the low energy photons are absorbed. In each junction, electron-hole pairs are generated, and current is collected at the ohmic contacts of the solar cell (2 and 52 in FIG. 1). Semiconductor materials used to form the junctions include, for example, germanium and alloys of one or more elements from Group III and Group V of the periodic table. Examples of these alloys include indium gallium phosphide, indium phosphide, gallium arsenide, aluminum gallium arsenide, indium gallium arsenide, gallium antimonide, indium phosphide, and dilute nitride compounds. For ternary and quaternary compound semiconductors, a wide range of alloy ratios can be used. Tunnel junctions are used between neighboring cells to interconnect the cells.

Dilute nitrides are advantageous as solar cell materials because the lattice constant can be varied to match a broad range of substrates and/or junctions formed from semiconductor materials other than dilute nitrides. Since dilute nitrides provide high quality, lattice-matched and band gap-tunable junctions, solar cells comprising dilute nitride junctions can achieve high conversion efficiencies on industry-standard substrates. The increase in efficiency is largely due to less light energy being lost as heat, as the additional junctions allow more of the incident photons to be absorbed by semiconductor materials with band gaps closer to the energy of the incident photons. In addition, there will be lower series resistance losses in these multijunction solar cells compared to other solar cells due to the lower operating currents. At higher concentrations of sunlight, the reduced series resistance losses become more pronounced. Depending on the band gap of the bottom junction, the collection of a wider range of photons in the solar spectrum may also contribute to the increased efficiency.

Examples of dilute nitrides include GaInNAsSb, GaInNAsBi, GaInNAsSbBi, GaNAsSb, GaNAsBi and GaNAsSbBi. The lattice constant and band gap of a dilute nitride can be controlled by the relative fractions of the different Group IIIA and Group VA elements. Further, high quality material may be obtained by selecting the composition around a specific lattice constant and band gap, while limiting the total antimony and/or bismuth content, for example, to no more than 20 percent of the Group V lattice sites. Antimony and bismuth are believed to act as surfactants that promote smooth growth morphology of the III-AsNV dilute nitride alloys. Thus, by tailoring the compositions (i.e., the elements and quantities) of a dilute nitride material, a wide range of lattice constants and band gaps may be obtained. The band gaps and compositions can be tailored so that the short-circuit current density produced by a dilute nitride junction will be the same as or slightly greater than the short-circuit current density of each of the other junctions in the solar cell.

The junction in the cell with the lowest current is the current limiting cell, and limits the maximum current flow in the device, reducing efficiency. Low currents may be generated by cells where the optical absorption coefficient is weak, or by cells where thin junctions are needed for carrier collection or end-of-life concerns, and so increasing the absorption within such a cell, and hence the current generated by the cell, is desirable.

Distributed Bragg reflectors (DBRs) have been proposed to improve the performance of cells. A DBR underlying a given cell can be designed to reflect unabsorbed light back into the cell, which can be absorbed and then contributes to improved current generation.

U.S. Pat. Nos. 8,716,593 and 9,257,586 disclose a DBR underlying a GaInNAs J2 junction of a 3J device. For the 3J solar cell to function with reasonable efficiency, the band gaps for a J1/GaInNAs J2/Ge 3J solar cell can be 1.9 eV/1.35-1.4 eV/0.7 eV. The reflectivity spectrum shows that a high reflectivity greater than about 60% can be achieved over a wavelength range of about 100 nm from about 800 nm to 900 nm. While wavelengths longer than about 900 nm can be transmitted to the underlying Ge junction, there are a number of reflectivity "ripples" up to about 20% or 10% or 5%. While an underlying Ge cell can have sufficient current to be able to tolerate some reflectivity loss, any underlying cell can generally suffer a decreased performance, which can be undesirable.

U.S. Pat. No. 9,018,521 discloses a DBR underlying a first junction J1 of an inverted metamorphic, non-lattice-matched, multijunction (IMM) solar cell.

U.S Patent Application No. 2010/0147366 discloses DBRs underlying a second junction J2 and a third junction J3 of an inverted metamorphic, non-lattice-matched, multi-junction (IMM) solar cell.

U.S. Patent Application No. 2017/0200845 discloses solar cells with a first DBR and a second DBR, where the DBRs reflect at different wavelength ranges, underlying a dilute nitride cell in a multijunction solar cell.

However, the bandwidth of semiconductor DBRs is typically limited to about 100 nm. Although some work mentions larger reflectivity bandwidths, specific designs to achieve larger bandwidths are not described. For example, although a dual-layer DBR appears to be operable over approximately 150 nm wavelength range, designs that are capable of extending reflectivity across a larger wavelength range, for example, corresponding to the absorption spectrum in the dilute nitride junction, are not described. Furthermore, the reflectivity spectrum of a semiconductor DBR can exhibit ripples at longer wavelengths than the high reflectivity band. This can reduce the levels of longer wavelength light that may be passed into an underlying subcell (or subcells), thereby reducing the current generated by the underlying subcell (or subcells). These problems can also exist in multicolor photodetectors which can have more than one light absorbing region, with at least one light absorbing region overlying the reflector and at least one light absorbing region underlying the reflector.

Dilute nitride heterostructures can exhibit high background doping levels, low minority carrier lifetimes and short minority carrier diffusion lengths, which can reduce the photocarrier collection volume within the device. This limits the short circuit current density (Jsc) that can be generated, and also reduces cell efficiency. Material quality can be improved by decreasing the nitride incorporation, but this increases the bandgap of the material, changing the absorption spectrum, and reducing the absorption level. Structures capable of providing reflection across a desired wavelength range can be used to reflect unabsorbed photons back into a thinner absorption region, effectively increasing the absorption level for a thin region. Such reflecting structures are also required to compensate for reduced absorption at longer wavelengths that are associated with larger bandgap material. However, residual reflectivity of typical structures can result in current reduction in underlying subcells. Although structures such as edge filters are known, they are fabricated from dielectric materials that are incompatible with semiconductor growth processes and cannot be monolithically integrated. It would therefore be useful to achieve, using semiconductor layers, a high reflectivity over a large wavelength range that covers the absorption range for a particular junction or subcell while minimizing the reflectivity at other wavelengths, so that the performance of underlying subcells is not affected.

SUMMARY

According to the present invention, semiconductor edge filters are disclosed, wherein the edge filter is configured to provide a reflectivity greater than 90% in a first wavelength range, with a full-width-half-maximum greater than 100 nm, or greater than 150 nm or greater than 200 nm, and a transmissivity greater than 95% or 98%, or 99% at a second wavelength range over a wavelength range greater than 500 nm or greater than 750 nm.

According to the present invention, semiconductor structures comprise: a semiconductor edge filter; a first light absorbing region overlying the semiconductor edge filter having a first bandgap and a first absorption spectrum; and a second light absorbing region underlying the semiconductor edge filter having a second bandgap and a second absorption spectrum (wherein the semiconductor edge filter reflects a first wavelength range back into the first light absorbing region, that is absorbable by said absorbing region, and allows a second wavelength range that is absorbable by the second light absorbing region to pass through into the second light absorbing region).

According to the present invention, semiconductor structures comprise: the semiconductor structure according to the present invention; a first doped layer underlying the second light absorbing region; and a second doped layer overlying the first light absorbing region.

According to the present invention, semiconductor devices comprise the semiconductor structure according to the present invention.

According to the present invention, multijunction photovoltaic cells comprise the semiconductor structure according to the present invention.

According to the present invention, photovoltaic modules comprise a semiconductor device according to the present invention.

According to the present invention, power systems comprise the photovoltaic module according to the present invention.

According to the present invention, methods of fabricating a semiconductor structure comprise: providing a semiconductor substrate; depositing a semiconductor edge filter on the semiconductor substrate, and depositing a first optical absorbing region on the semiconductor edge filter, wherein the first optical absorbing region has a bandgap and an associated absorption spectrum, and wherein the semiconductor edge filter reflects a first wavelength range back into the first optical absorbing region, that is absorbable by said absorbing region, and transmits a second wavelength range that is absorbable by an underlying semiconductor to pass through into said underlying semiconductor.

BRIEF DESCRIPTION OF THE DRAWINGS

Those skilled in the art will understand that the drawings described herein are for illustration purposes only. The drawings are not intended to limit the scope of the present disclosure.

FIG. 6 shows an example of compositions and functions of certain layers that may be present in a 3J multijunction photovoltaic cell comprising AlInGaP/(Al,In)GaAs/GaInNAsSb.

FIG. 7 shows an example of compositions and functions of certain layers that may be present in a 4J multijunction photovoltaic cell comprising AlInGaP/(Al,In)GaAs/GaInNAsSb/Ge.

DETAILED DESCRIPTION

Figure 1:
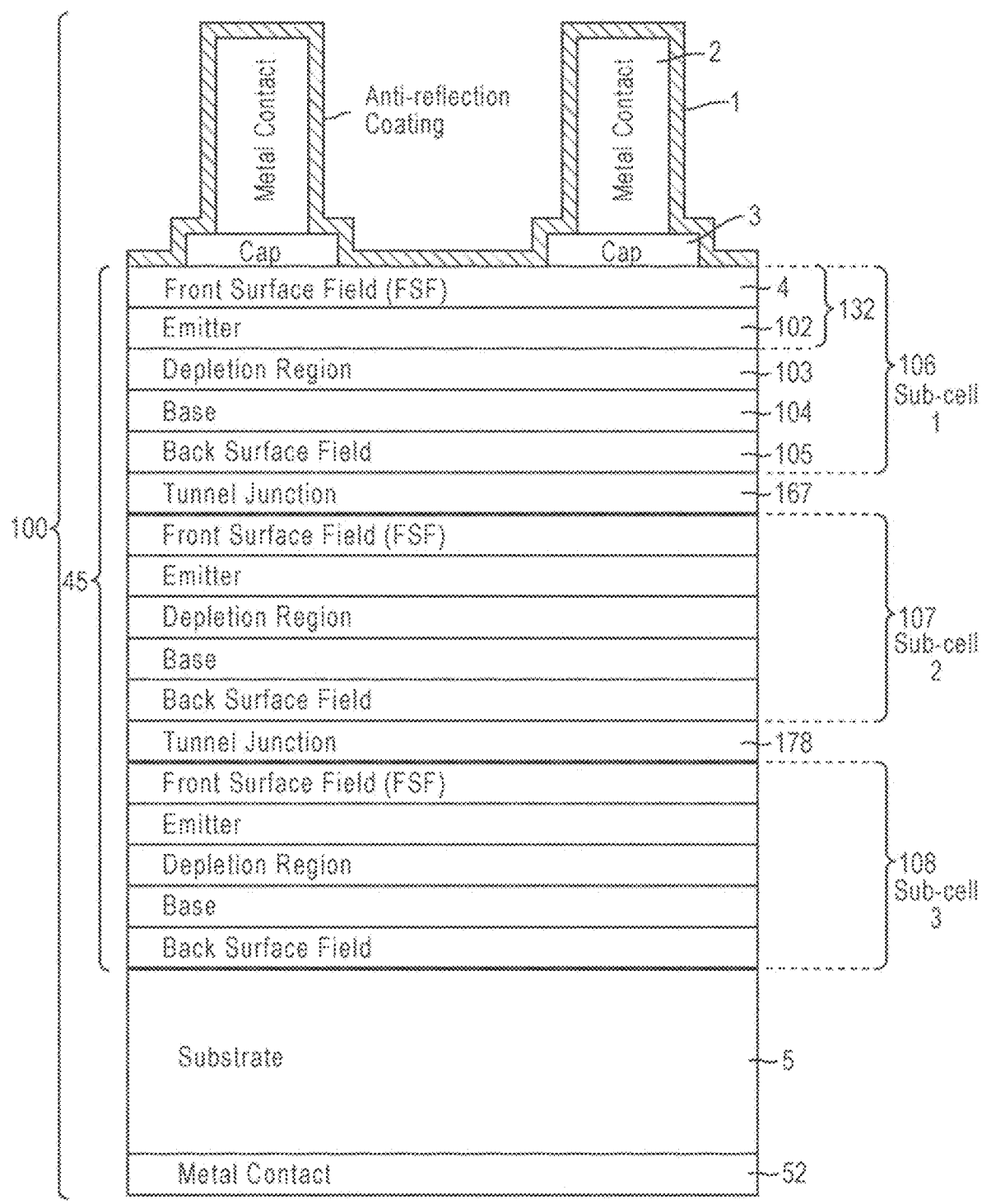
FIG. 1 shows a cross-section of an example of a prior art multijunction solar cell.

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized, and structural, logical, and electrical changes may be made without departing from the scope of the invention. The various embodiments disclosed herein are not necessarily mutually exclusive, as some disclosed embodiments may be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

Also, it should be understood that any numerical range recited herein is intended to include all sub-ranges encompassed therein. For example, a range of "1 to 10" is intended to include all sub-ranges between (and including) the recited minimum value of about 1 and the recited maximum value of about 10, that is, having a minimum value equal to or greater than about 1 and a maximum value of equal to or less than about 10.

Also, in this application, the use of "or" means "and/or" unless specifically stated otherwise, even though "and/or" may be explicitly used in certain instances.

"Lattice matched" refers to semiconductor layers for which the in-plane lattice constants of adjoining materials in their fully relaxed states differ by less than 0.6% when the materials are present in thicknesses greater than 100 nm.

Further, junctions that are substantially lattice matched to each other means that all materials in the junctions that are present in thicknesses greater than 100 nm have in-plane lattice constants in their fully relaxed states that differ by less than 0.6%. In an alternative meaning, substantially lattice matched refers to the strain. As such, base layers can have a strain from 0.1% to 6%, from 0.1% to 5%, from 0.1% to 4%, from 0.1 to 3%, from 0.1% to 2%, or from 0.1% to 1%; or can have strain less than 6%, less than 5%, less than 4%, less than 3%, less than 2%, or less than 1%. Strain refers to compressive strain and/or to tensile strain.

The term "pseudomorphically strained" as used herein means that layers made of different materials with a lattice parameter difference can be grown on top of other lattice matched or strained layers without generating misfit dislocations. In certain embodiments, the lattice parameters differ by up to +/−2%. In other certain embodiments, the lattice parameters differ by up to +/−1%. In other certain embodiments, the lattice parameters differ by up to +/−0.5%. In further certain embodiments, the lattice parameters differ by up to +/−0.2%.

The devices and methods of the present invention facilitate the manufacture of high quality multijunction solar cells. The disclosure teaches devices comprising a semiconductor edge filter underlying a first subcell of a multijunction solar cell and overlying a second subcell of a multijunction solar cell and methods of making such devices. The first subcell can comprise a dilute nitride semiconductor layer. Multijunction solar cells can also comprise lattice-mismatched multijunction solar cells such as an inverted metamorphic multijunction (IMM) solar cell, comprising a graded interlayer to transition the lattice constant from that of a first subcell to that of a second subcell, and a semiconductor edge filter underlying one subcell and overlying another subcell of the IMM solar cell. Multijunction solar cells comprising a semiconductor edge filter underlying a first subcell and overlying a second subcell exhibit improved performance.

Semiconductor devices provided by the present disclosure can comprise a semiconductor edge filter, a first light absorbing region overlying the semiconductor edge filter having a first bandgap and a first absorption spectrum, and a second light absorbing region underlying the semiconductor edge filter having a second bandgap and a second absorption spectrum, wherein the semiconductor edge filter, wherein the semiconductor edge filter is configured to provide a high reflectivity for the first wavelength range and a high transmissivity over the second wavelength range.

Semiconductor devices provided by the present disclosure can comprise a first layer comprising a dilute nitride, a semiconductor edge filter layer underlying the first layer; and a second layer underlying the semiconductor edge filter layer, wherein the first layer, the semiconductor edge filter, and the second layer are lattice matched to each of the other layers. Examples of semiconductor devices include power converters, transistors, lasers, light emitting diodes, optoelectronic devices, and solar cells such as a multijunction solar cells. The dilute nitride layer can comprise GaInNAs, GaInNAsSb, GaInNAsBi, GaInNAsSbBi, GaNAsSb, GaNAsBi, or GaNAsSbBi. A dilute nitride layer can comprise GaInNAsSb, GaInNAsBi, or GaInNAsSbBi. A dilute nitride layer can comprise GaInNAsSb.

A multijunction solar can comprise at least three layers, such as a three junction 3J, a four junction (4J), a five junction (5J), or a six junction (6J) solar cell, in which at least one of the junctions comprises a dilute nitride. A multijunction solar cell can comprise, for example, one dilute nitride junction or two dilute nitride junctions.

A multijunction solar cell can comprise a dilute nitride junction, a semiconductor edge filter layer underlying the dilute nitride junction, and a (Si,Sn)Ge junction underlying the semiconductor edge filter layer. In multijunction solar cells comprising two dilute nitride junctions, a separate semiconductor edge filter layer can underlie each of the dilute nitride junctions, or a single semiconductor edge filter layer can underlie the lowermost dilute nitride junction.

A dilute nitride junction can comprise GaInNAsSb, GaIn-NAsBi, GaInNAsSbBi, GaNAsSb, GaNAsBi, or GaNAsSbBi. A dilute nitride junction can comprise GaIn-NAsSb, GaInNAsBi, or GaInNAsSbBi. A dilute nitride junction can comprise GaInNAsSb.

A dilute nitride junction can have a thickness, for example, from 0.5 microns to 4 microns, from 0.5 microns to 3.5 microns, from 0.5 microns to 3 microns, from 0.5 microns to 2.5 microns, from 0.5 microns to 2 microns, from 0.5 microns to 1.5 microns, or from 1 microns to 2 microns.

As shown in FIG. 1, a multijunction solar cell 100 can include substrate 5, back metal contact 52, top metal contact 2 including cap regions 3 and heteroepitaxial layers 45 forming each of the junctions. An ARC 1 overlies metal contact 2, cap regions 3, and the front surface of the uppermost junction 106. The multijunction solar cell shown in FIG. 1 includes three junctions 106, 107, and 108. Each junction can comprise a front surface field 4 and emitter 102 forming element 132, depletion region 103, base 104, back surface field 105, and tunnel junction 167. An ARC 1 can cover the top surface of the multijunction solar cell. Tunnel junction 178 interconnects second junction 107 and third junction 108. Heteroepitaxial layers 45 overlie substrate 5 and a metal contact 52 is disposed on the back side of substrate 5. Substrate 5 can also be an active junction of the multijunction solar cell such as when the substrate comprises (Si,Sn)Ge.

Figure 2A:
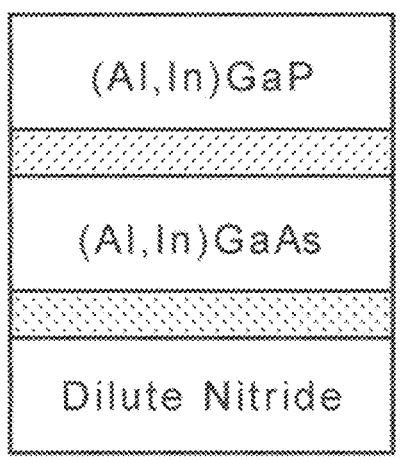
FIG. 2A shows schematic of a cross-section of a multijunction solar cell with three junctions.
Figure 2B:
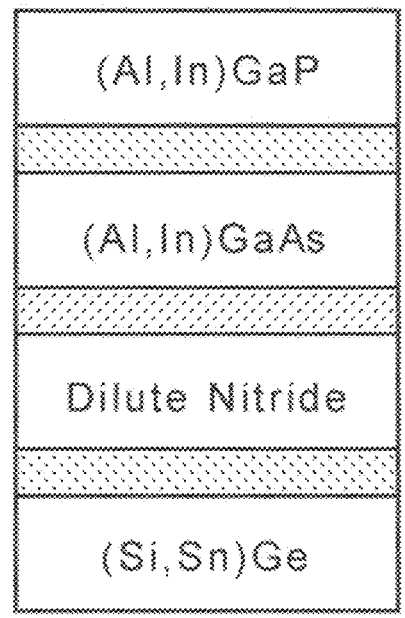
FIGS. 2B and 2C show schematic cross-sections of multijunction solar cells with four junctions.
Figure 2C:
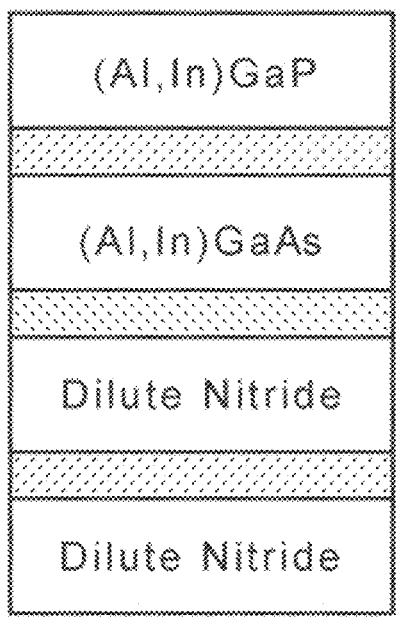
Figure 2D:
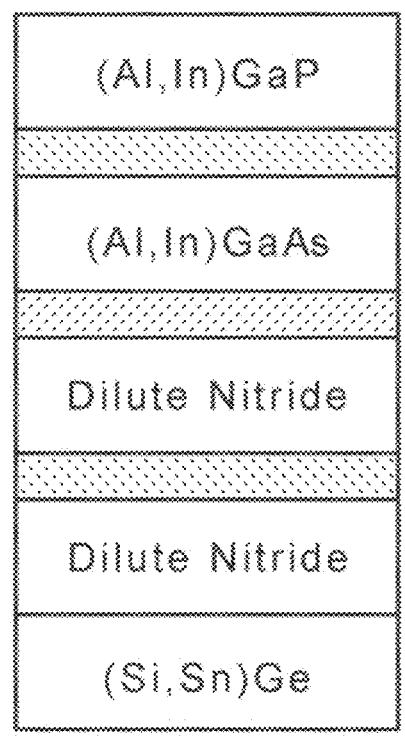
FIG. 2D is a schematic cross-section of a multijunction solar cell with five junctions.

FIGS. 2A-2D show schematics of multijunction solar cells comprising at least one dilute nitride junction. FIG. 2A shows a three junction 3J solar cell comprising a (Al,In)GaP junction, a (Al,In)GaAs junction, and a dilute nitride junction. FIG. 2B shows a four junction 4J solar cell comprising a (Al,In)GaP junction, a (Al,In)GaAs junction, a dilute nitride junction, and a (Si,Sn)Ge junction. The (Al,In)GaP junction can have a band gap from 1.9 eV to 2.2 eV; the (Al,In)GaAs junction can have a band gap from 1.4 eV to 1.7 eV; the dilute nitride junction can have a band gap from 0.9 eV to 1.3 eV; and the (Si,Sn)Ge junction can have a band gap from 0.7 eV to 0.9 eV. FIG. 2C shows a four junction 4J solar cell comprising a (Al,In)GaP junction, a (Al,In)GaAs junction, and two dilute nitride junctions. The (Al,In)GaP junction can have a band gap from 1.9 eV to 2.2 eV; the (Al,In)GaAs junction can have a band gap from 1.4 eV to 1.7 eV; the dilute nitride junction (J3) can have a band gap from 1.0 eV to 1.3 eV; and the dilute nitride junction (J4) can have a band gap from 0.7 eV to 1.1 eV. FIG. 2D shows a five junction 5J solar cell comprising a (Al,In)GaP junction, a (Al,In)GaAs junction, two dilute nitride junctions, and a (Si,Sn)Ge junction.

A multijunction solar cell is configured such that the junction having the highest band gap faces the incident solar radiation, with junctions characterized by increasingly lower band gaps situated underlying or beneath the uppermost junction. For optimal efficiency, the specific band gaps of the junctions are dictated, at least in part, by the band gap of the bottom junction, the thicknesses of the junction layers, and the spectrum of incident light. All junctions within a multijunction solar cell can be substantially lattice-matched to each of the other junctions. A multijunction solar cell may be fabricated on a substrate such as a (Si,Sn)Ge substrate. The substrate can comprise gallium arsenide, indium phosphide, gallium antimonide, (Si,Sn)Ge, silicon, or an engineered substrate such as a buffered silicon substrate. Examples of buffers that can be grown on silicon to produce a substrate with a lattice constant that is equal or approximately equal to the lattice constant of Ge or GaAs include SiGeSn, and rare-earth oxides (REOs). Each of the junctions can be substantially lattice-matched to a substrate. In some embodiments, such as an IMM solar cell, the junctions within a multijunction solar cell do not need to be substantially lattice-matched to each of the other junctions, as is known in the art.

Dilute nitrides are advantageously used as photovoltaic cell materials because the lattice constant can be varied to substantially match a broad range of substrates and/or junctions formed from semiconductor materials other than dilute nitrides. Examples of dilute nitrides include GaInNAs, GaInNAsSb, GaInNAsBi, GaInNAsSbBi, GaNAsSb, GaNAsBi and GaNAsSbBi. The lattice constant and band gap of a dilute nitride can be controlled by the relative fractions of the different group IIIA and group VA elements. Thus, by tailoring the compositions (i.e., the elements and quantities) of a dilute nitride material, a wide range of lattice constants and band gaps may be obtained. Further, high quality material may be obtained by adjusting the composition around a specific lattice constant and band gap, while limiting the total Sb and/or Bi content, for example, to no more than 20 percent of the Group V lattice sites, such as no more than 10 percent of the Group V lattice sites. Sb and Bi are believed to act as surfactants that promote smooth growth morphology of the III-AsNV dilute nitride alloys. In addition, Sb and Bi can facilitate uniform incorporation of nitrogen and minimize the formation of nitrogen-related defects. The incorporation of Sb and Bi can enhance the overall nitrogen incorporation and reduce the alloy band gap. However, Sb and Bi can create additional defects and therefore it is desirable that the total concentration of Sb and/or Bi be limited to no more than 20 percent of the Group V lattice sites. Further, the limit to the Sb and Bi content decreases with decreasing nitrogen content. Alloys that include indium can have even lower limits to the total content because In can reduce the amount of Sb needed to tailor the lattice constant. For alloys that include In, the total Sb and/or Bi content may be limited to no more than 5 percent of the Group V lattice sites, in certain embodiments, to no more than 1.5 percent of the Group V lattice sites, and in certain embodiments, to no more than 0.2 percent of the Group V lattice sites. For example, $Ga_{1-x}In_xN_yAs_{1-y-z}Sb_z$, disclosed in U.S. Pat. No. 8,912,433, which is incorporated by reference in its entirety, can produce a high-quality material when substantially lattice-matched to a GaAs or a Ge substrate in the composition range of $0.07 \leq x \leq 0.18$, $0.025 \leq y \leq 0.04$ and $0.001 \leq z \leq 0.03$, with a band gap of at least 0.9 eV such as within a range from 0.9 eV to 1.1 eV. U.S. Pat. Nos. 8,697,481, and 8,962,993, both of which are incorporated by reference in its entirety, disclose $Ga_{1-x}In_xN_yAs_{1-y-z}Sb_z$ in the composition range of $0 \leq x \leq 0.24$, $0.001 \leq y \leq 0.07$ and $0.001 \leq z \leq 0.20$, with bandgap between 0.7 eV and 1.4 eV. Co-pending U.S. Application Publication No. 2019/0013430, which is incorporated by reference in its entirety, discloses dilute nitride absorbing regions comprising $Ga_{1-x}In_xN_yAs_{1-y-z}Sb_z$, where x, y and z fall within the ranges $0 \leq x \leq 0.4$, $0 < y \leq 0.07$ and $0 \leq z \leq 0.2$, respectively. In some embodiments, x, y and z can fall within the ranges of $0.01 \leq x \leq 0.4$, $0.02 \leq y \leq 0.06$ and $0.001 \leq z \leq 0.04$, respectively.

In certain embodiments of dilute nitrides provided by the present disclosure, the N composition is not more than 10 percent of the Group V lattice sites. In certain embodiments the N composition is not more than 7 percent, in certain embodiments not more than 5.5 percent, in certain embodiments not more than 4%, and in certain embodiments, not more than 3.5 percent.

In certain embodiments of dilute nitrides provided by the present invention, the dilute nitrides comprise $Ga_{1-x}In_xN_yAs_{1-y-z}Sb_z$, where x, y and z fall within the ranges $0 \leq x \leq 0.4$, $0 < y \leq 0.1$ and $0 \leq z \leq 0.2$, respectively. In some embodiments, x, y and z can fall within the ranges of $0.01 \leq x \leq 0.4$, $0.02 \leq y \leq 0.07$ and $0.001 \leq z \leq 0.04$, respectively.

Embodiments of the present disclosure include dilute nitride junctions, comprising, for example, GaInNAsSb, GaInNAsBi, or GaInNAsBiSb in the base layer that can be incorporated into multijunction photovoltaic cells that perform at high efficiencies. The band gaps of the dilute nitrides can be tailored by varying the composition while controlling the overall content of Sb and/or Bi. Thus, a dilute nitride junction with a band gap suitable for integrating with other junction may be fabricated while maintaining substantial lattice-matching to each of the other junctions and to the substrate. The band gaps and compositions can be tailored so that the Jsc produced by the dilute nitride junctions will be the same as or slightly greater than the Jsc of each of the other junctions in the solar cell. Because dilute nitrides provide high quality, lattice-matched and band gap-tunable subcells, photovoltaic cells comprising dilute nitride junctions can achieve high conversion efficiencies. The increase in efficiency is largely due to less light energy being lost as heat, as the additional subcells allow more of the incident photons to be absorbed by semiconductor materials with band gaps closer to the energy of the incident photons. In addition, there will be lower series resistance losses in these multijunction photovoltaic cells compared to other photovoltaic cells due to the lower operating currents. At higher concentrations of sunlight, the reduced series resistance losses become more pronounced. Depending on the band gap of the bottom subcell, the collection of a wider range of photons in the solar spectrum may also contribute to the increased efficiency.

Due to interactions between the different elements, as well as factors such as the strain in the dilute nitride layer, the relationship between composition and band gap for a dilute nitride such as $Ga_{1-x}In_xN_yAs_{1-y-z}Sb_z$ is not a simple function of composition. The composition that yields a desired band gap with a specific lattice constant can be found by empirically varying the composition. However, the quality of the $Ga_{1-x}In_xN_yAs_{1-y-z}Sb_z$ alloy as reflected in attributes such as the Jsc, Voc, FF, and efficiency can depend on processing and annealing conditions and parameters. High efficiency multijunction solar cells comprising dilute nitrides are disclosed, for example, in U.S. Pat. No. 8,912,433 and U.S. Application Publication No. 2017/0110613, each of which is incorporated by reference in its entirety. High efficiency GaInNAsBi and GaInNAsSbBi junctions are disclosed in U.S. Application Publication No. 2017/036573, which is incorporated by reference in its entirety.

Dilute nitride sub-cells having graded doping profiles are disclosed in U.S. Pat. No. 9,214,580, U.S. Patent Application Publication No. 2016/9118526, and U.S. Patent Application Publication No. 2017/0338357, each of which is incorporated by reference in its entirety. Graded doping profiles have been shown to improve the performance of the dilute nitride subcells. Such subcells can comprise an unintentionally doped dilute nitride region, having a first thickness and having an unintentional doping concentration less than about $1 \times 10^{15}/cm^3$, and a doped dilute nitride region having a second thickness and a dopant concentration between $1 \times 10^{15}/cm^3$ and $1 \times 10^{19}/cm^3$, wherein the first thickness is between 0.3 μm and 1.5 μm, and the second thickness is between 1 μm and 2 μm, and wherein the first thickness is lesser than the second thickness.

Figure 3:
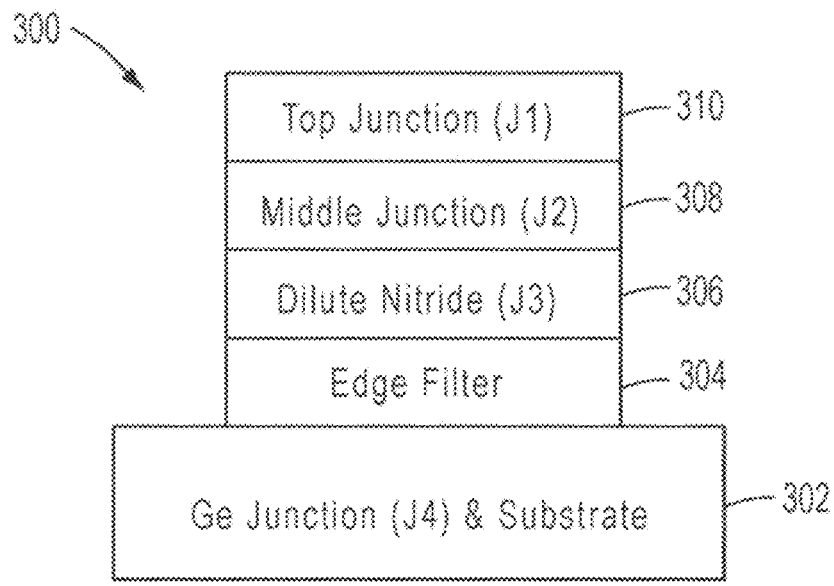
FIG. 3 shows a schematic cross section of an example of a four junction solar cell according to the present invention.

FIG. 3 shows a schematic cross-section of a four junction (4J) multijunction solar cell 300 according to the present invention. Device 300 comprises a substrate 302, a semiconductor edge filter 304, a dilute nitride junction (J3) 306, a middle junction (J2) 308, and a top junction (J1) 310.

In some embodiments, the substrate 302 has a lattice constant that matches or nearly matches the lattice constant of GaAs or Ge. In one embodiment as shown, the substrate 302 is Ge and can form a subcell (J4) for a multijunction solar cell, having a p-n junction as is known in the art. Substrate 302 has a first bandgap energy.

Semiconductor edge filter 304 overlies substrate 302 and can comprise alternating layers of materials having different refractive indices and thicknesses, as described herein. The refractive index difference between the layers, and the layer thicknesses provide a high reflectivity over a first wavelength range and a high transmissivity over a second wavelength range. Semiconductor edge filter 304 comprises at least two different materials with different refractive indices and at least two different layer thicknesses. Semiconductor edge filter 304 can comprise, for example semiconductor materials of Groups III and V of the periodic table such as, for example, AlAs, AlGaAs, GaAs, InAs, InGaAs, AlInAs, InGaP, AlInGaP, InGaP, GaP, InP, AlP, AlInP, or AlInGaAs. The compositions for semiconductor edge filter 304 are chosen to be lattice matched or pseudomorphically strained to the substrate. The number, order, and thickness of the layers can be selected in such a way that a first desired range of the incident solar spectrum is reflected by the semiconductor edge filter into the junction(s) overlying the semiconductor edge filter and a second desired range of the incident solar spectrum is transmitted into the junction(s) underlying the semiconductor edge filter. The thickness of the overlying junction can be reduced by using a semiconductor edge filter without reducing light absorption in the overlying junction, as will be described later. Electrical properties of the semiconductor edge filter can be tuned by doping the edge filter interlayers with Si, Te, Zn, C, Mg, and/or Se.

Overlying semiconductor edge filter 304, a dilute nitride junction or subcell (J1) 306 is formed. The lattice constant for subcell 306 is lattice matched or pseudomorphically strained to the substrate. In some embodiments, the dilute nitride subcell comprises GaInNAs. In some embodiments, the dilute nitride subcell comprises GaInNAsSb. Subcell 306 has a second bandgap that is larger than the first bandgap of substrate 302. In some embodiments, the GaInNAsSb comprises $Ga_{1-x}In_xN_yAs_{1-y-z}Sb_z$, where x, y and z fall within the ranges $0 \leq x \leq 0.4$, $0 < y \leq 0.1$ and $0 < z \leq 0.2$, respectively. In some embodiments, the bandgap of the dilute nitride subcell 306 is between 0.7 eV and 1.3 eV or between 0.9 eV and 1.2 eV or between 0.95 eV and 1.1 eV.

Subcell 308 overlies subcell 306. Subcell 308 is lattice matched or pseudomorphically strained to the substrate. Subcell 308 has a third bandgap that is larger than the second bandgap. In some embodiments, subcell 308 comprises (Al,In)GaAs.

Subcell 310 overlies subcell 308. Subcell 310 is lattice matched or pseudomorphically strained to the substrate. Subcell 310 has a fourth bandgap that is larger than the third bandgap. In some embodiments, subcell 308 comprises (Al,In)GaP.

Figure 4:
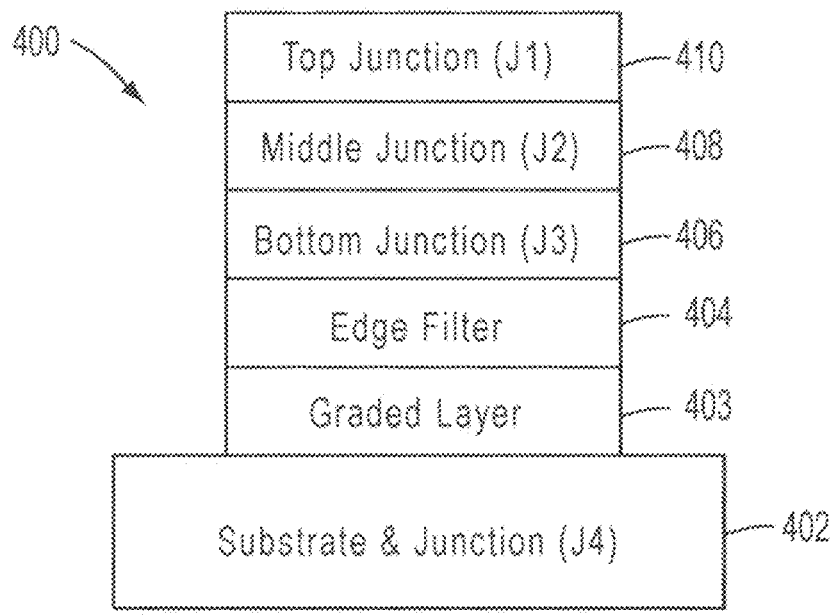
FIG. 4 shows a schematic cross-section of an example of a four junction solar cell according to the present invention.

FIG. 4 shows a schematic cross section of another four junction (4J) multijunction solar cell 400. Device 400 comprises a substrate 402, a graded layer 403, a semiconductor edge filter 404, a bottom junction (J3) 406, a middle junction (J2) 408 and a top junction (J1) 410. Substrate 402 has a first lattice constant and a first bandgap. A p-n junction is formed using the substrate by depositing doped semiconductor materials lattice matched to the substrate to form a p-n junction. An example of a substrate is GaSb.

Semiconductor materials are deposited on substrate 402 to form a graded layer (or metamorphic layer). The graded layer is a compositionally step-graded series of sub-layers preferably with monotonically changing lattice constant in each step, so that the sequence of sublayers achieves a gradual transition in lattice constant in the semiconductor structure from the lattice constant of substrate 402 to the lattice constant of overlying layers 404, 406, 408 and 410, while minimizing threading dislocations from occurring. In some embodiments, the sublayers are AlGaAsSb. In other embodiments, the sublayers are InGaAlAs. In some embodiments, the overlying layers have a lattice constant that matches or nearly matches the lattice constant of GaAs or Ge.

After the graded layer is formed, semiconductor edge filter 404 is then formed. A bottom subcell or junction 406 is then formed, having a second bandgap that is larger than the first bandgap. In some embodiments, first subcell 406 is a dilute nitride junction or subcell. In this example, two further subcells (408 and 410) are included in the structure, with all subcells coupled by tunnel junctions (not shown), providing series connection of the multiple p-n junctions (subcells).

Figure 5A:
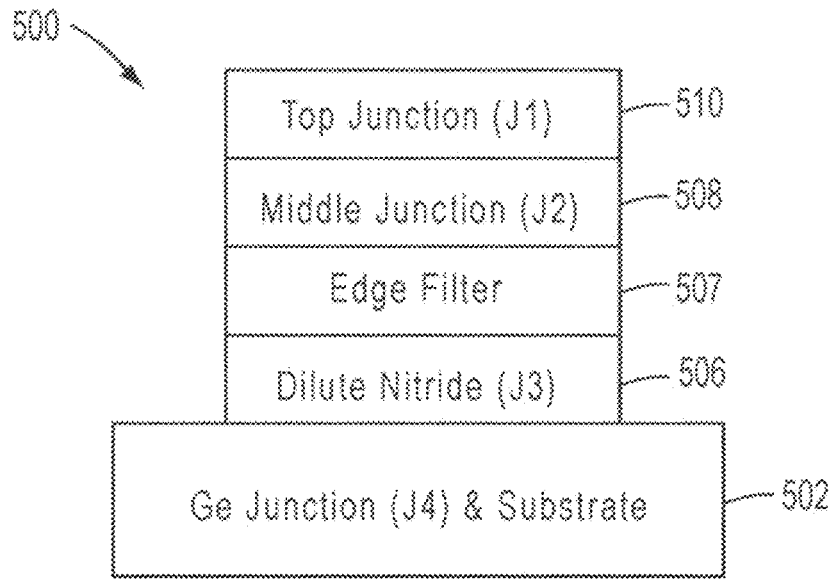
FIGS. 5A and 5B show schematic cross-sections of examples of four junction solar cells according to the present invention.
Figure 5B:
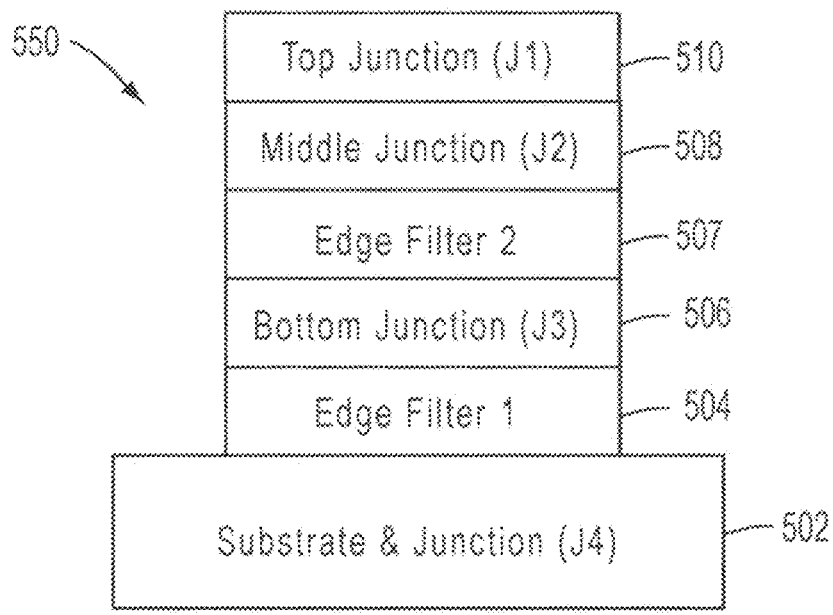

FIGS. 5A and 5B show schematic cross sections of four junction (4J) multijunction solar cells 500 and 550 in accordance with the invention. In FIG. 5A, taking Ge as the substrate 502, the Ge layer(s) can form a bottom subcell, having a p-n junction. Subcell 506 is then formed, and in this example is a dilute nitride junction or subcell. A semiconductor edge filter 507 is then formed, followed by two further subcells (508 and 510), with all subcells coupled by tunnel junctions (not shown), providing series connection of the multiple p-n junctions (subcells). In FIG. 5B, taking Ge as the substrate 502, the Ge layer(s) can form a bottom subcell, having a p-n junction. A first semiconductor edge filter 504 is then formed, followed by subcell 506. In this example, subcell 506 is a dilute nitride junction or subcell. A second semiconductor edge filter 507 is then formed, followed by two further subcells (508 and 510), with all subcells coupled by tunnel junctions (not shown), providing series connection of the multiple p-n junctions (subcells). First semiconductor edge filter 504 is designed to reflect wavelengths absorbed by subcell 506 and transmit wavelengths absorbed by substrate (and subcell) 502. Second semiconductor edge filter 507 is designed to reflect wavelengths absorbed by subcell 508 and transmit wavelengths absorbed by subcell 506, and substrate (and subcell) 502.

A practitioner skilled in the art understands that other types of layers may be incorporated or omitted in photovoltaic cells 300, 400, 500 and 550 to create a functional device and are not necessarily described here in detail. These other types of layers include, for example, coverglass, anti-reflection coating (ARC), contact layers, front surface field (FSF), tunnel junctions, window, emitter, back surface field (BSF), nucleation layers, buffer layers, and a substrate or wafer handle. In each of the embodiments described and illustrated herein, additional semiconductor layers can be present to create a photovoltaic cell device. Specifically, cap or contact layer(s), ARC layers and electrical contacts (also denoted as the metal grid) can be formed above the top subcell, and buffer layer(s), the substrate or handle, and bottom contacts can be formed or be present below the bottom subcell. In certain embodiments, the substrate may also function as the bottom junction, such as in a germanium junction. Multijunction photovoltaic cells may also be formed without one or more of the layers listed above, as known to those skilled in the art. Each of these layers requires careful design to ensure that its incorporation into a multijunction photovoltaic cell does not impair high performance.

Figure 11:
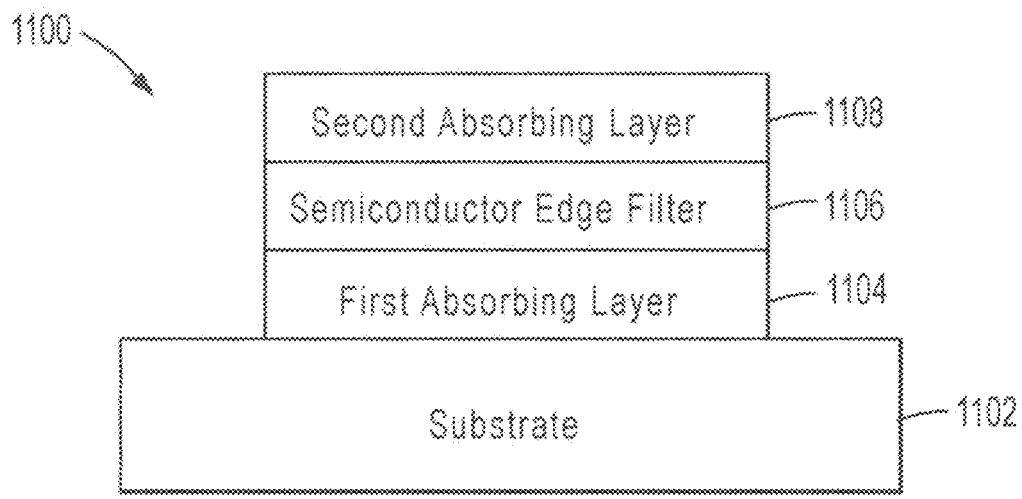
FIG. 11 shows a schematic cross-section of a multicolor photodetector according to the present invention.
Figure 12:
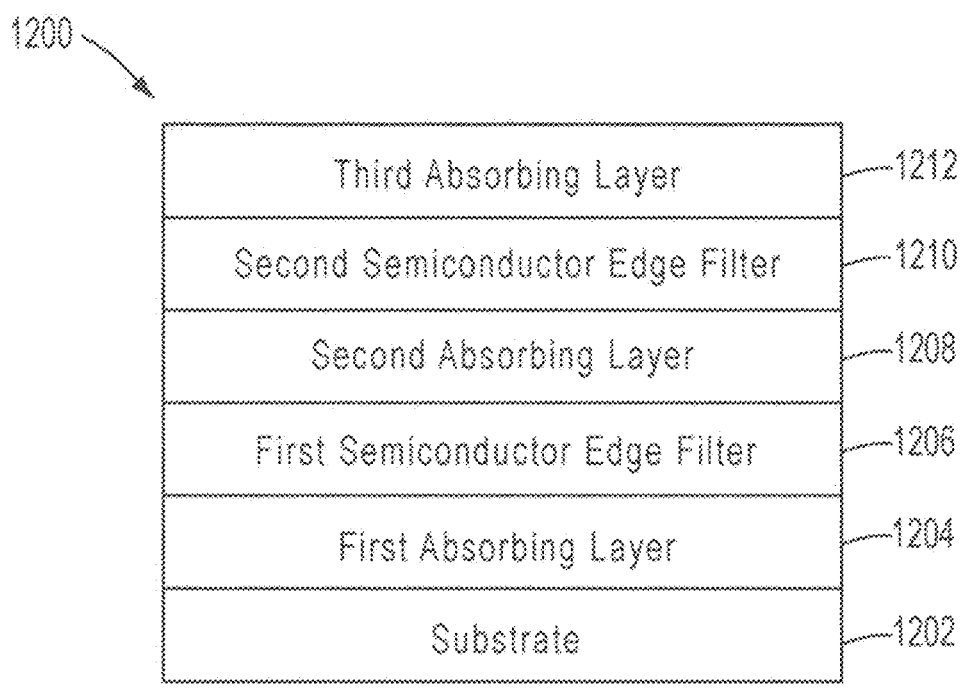
FIG. 12 shows a schematic cross-section of another multicolor photodetector according to the present invention.

FIGS. 11 and 12 show schematic cross sections of multicolor photodetectors 1100 and 1200 in accordance with the invention. In some examples, the substrate can be GaAs, Ge or can have a lattice constant that matches or nearly matches the lattice constant of GaAs or Ge, such as a buffered Silicon substrate.

In FIG. 11, a first absorbing layer 1104 is formed on substrate 1102. A semiconductor edge filter 1106 is then formed on first absorbing layer 1104 and a second absorbing layer 1108 is formed on semiconductor edge filter 1106.

In FIG. 12, a first absorbing layer 1204 is formed on substrate 1202. A first semiconductor edge filter 1206 is then formed on first absorbing layer 1204 and a second absorbing layer 1208 is formed on semiconductor edge filter 1206. A second semiconductor edge filter 1210 is formed on second absorbing layer 1208 and a third absorbing layer 1212 is formed on second semiconductor edge filter 1210. First semiconductor edge filter 1204 is designed to reflect wavelengths absorbed by second absorbing layer 1208 and transmit wavelengths absorbed by first absorbing layer 1204. Second semiconductor edge filter 1210 is designed to reflect wavelengths absorbed by third absorbing layer 1212 and transmit wavelengths absorbed by second absorbing region 1208, and first absorbing region 1204.

A practitioner skilled in the art understands that other types of layers may be incorporated or omitted in photodetectors 1100 and 1200 to create a functional device and are not necessarily described here in detail. These other types of layers include, for example, an anti-reflection coating (ARC), contact layers, buffer layers (including metamorphic buffer layers), tunnel junctions, and a substrate or wafer handle. In each of the embodiments described and illustrated herein, additional semiconductor layers can be present to create a multicolor photodetector device. Multicolor photodetectors may also be formed without one or more of the layers listed above, as known to those skilled in the art. Each of these layers requires careful design to ensure that its incorporation into a multicolor photodetector does not impair high performance.

FIG. 6 shows an example of a 4J structure (e.g., AlInGaP/(Al,In)GaAs/GaInNAsSb/Ge), with a high temperature barrier and nucleation layer comprising InAlPSb, illustrating possible additional semiconductor layers that may be present in multijunction photovoltaic cell 300. In this structure, a semiconductor edge filter overlies a buffer layer that is deposited on a substrate. In some embodiments, the semiconductor edge filter can also act as the buffer layer. The semiconductor edge filter is shown comprising GaAs/AlGaAs layers. The semiconductor edge filter comprises at least two different materials with different refractive indices and at least two different layer thicknesses. Semiconductor edge filter 304 can comprise, for example semiconductor materials of Groups III and V of the periodic table such as, for example, AlAs, AlGaAs, GaAs, InAs, InGaAs, AlInAs, InGaP, AlInGaP, InGaP, GaP, InP, AlP, AlInP, or AlInGaAs.

FIG. 7 shows an example of a 4J structure (e.g., lInGaP/(Al,In)GaAs/GaInNAsSb/GaSb), illustrating these possible additional semiconductor layers that may be present in multijunction photovoltaic cell 400. In this structure, semiconductor edge filter 404 overlies a graded layer that is deposited on a substrate to change the lattice constant from a first lattice constant of the substrate to a desired second lattice constant for the overlying layers. The semiconductor edge filter is shown comprising GaAs/AlGaAs layers. The semiconductor edge filter comprises at least two different materials with different refractive indices and at least two different layer thicknesses. Semiconductor edge filter 404 can comprise, for example semiconductor materials of Groups III and V of the periodic table such as, for example, AlAs, AlGaAs, GaAs, InAs, InGaAs, AlInAs, InGaP, AlInGaP, InGaP, GaP, InP, AlP, AlInP, or AlInGaAs.

In a conventional distribute Bragg reflector (DBR) designs which have a periodic structure, the thicknesses of the layers are chosen to be an integer multiple of the quarter wavelength, based on a desired design wavelength $\lambda_0$. That is, the thickness of a layer is chosen to be an integer multiple of $\lambda_0/4n$, where n is the refractive index of the material at wavelength $\lambda_0$. A DBR can comprise, for example semiconductor materials of Groups III and V of the periodic table such as, for example, AlAs, AlGaAs, GaAs, InAs, GaInAs, AlInAs, InGaP, AlInGaP, InGaP, GaP, InP, AlP, AlInP, or AlInGaAs. The number, order, and thickness of the layers can be selected in such a way that a desired range of the incident solar spectrum is reflected by the DBR into the junction(s) overlying the DBR. The thickness of the overlying junction can be reduced by using a DBR without reducing light absorption in the overlying junction.

However, at wavelengths outside of the high-reflectivity band, the DBRs will have a residual reflectivity, with a wavelength-dependent reflectivity spectrum. This can lead to a spectrally-dependent reduction of the transmission of portions of the solar spectrum that are absorbed by the junctions underlying the DBR, thereby reducing the current that can be generated by the underlying junctions.

In contrast to a distribute Bragg reflector (DBR), a semiconductor edge filter is not required to have a periodic structure and can be a non-periodic structure formed from alternating semiconductor materials with different refractive indices that can be used to achieve high reflection within a first range of frequencies or wavelengths absorbed by an overlying junction, and a high transmission within a second range of frequencies or wavelengths configured to be absorbed by an underlying junction or junctions. This ensures that current generation in the underlying junctions is not overly reduced by the semiconductor edge filter.

Figure 8:
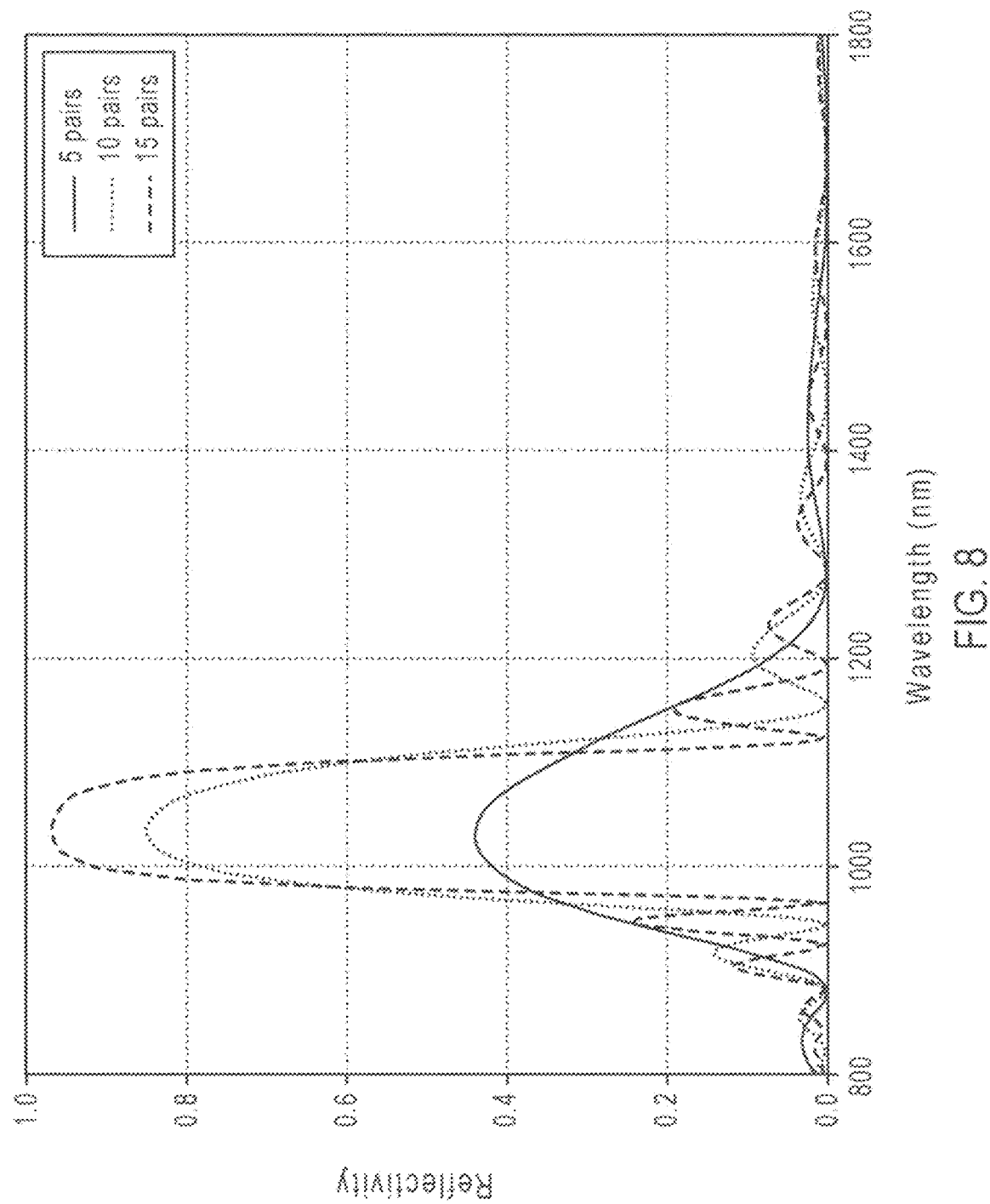
FIG. 8 shows reflectivity spectra for a DBR design with fixed layer thicknesses, and different numbers of mirror pairs.

FIG. 8 shows calculated spectral reflectivity of conventional DBRs having five (5) periodic structures, where each periodic structure comprises a pair of GaAs/AlGaAs interlayers, ten (10) periodic structures, and fifteen (15) periodic structures. The DBRs were designed for a normal maximum reflectivity at 1.05 μm. The thickness of each of the interlayers was between 70 nm and 90 nm. The normal reflectivity of the DBR increases with increasing number of periodic structures increases both the peak reflectivity and the stop-bandwidth (i.e., full-width-half-maximum). The effect is highly non-linear, as shown in FIG. 5, and quickly maximizes close to 100% reflectivity. Side-band reflectivity (i.e., reflectivity at wavelengths greater than 1,050 nm) results in some loss for absorption by an underlying layer such as a (Si,Sn)Ge junction. The DBR having fifteen (15) GaAs/AlGaAs pairs has a full-width-half-maximum (FWHM) of about 130 nm. The DBR designs show that increased reflectivity over a given wavelength range also produces reflectivity ripples at longer wavelengths that can be up to about 20% or 10% or 5%.

Figure 9:
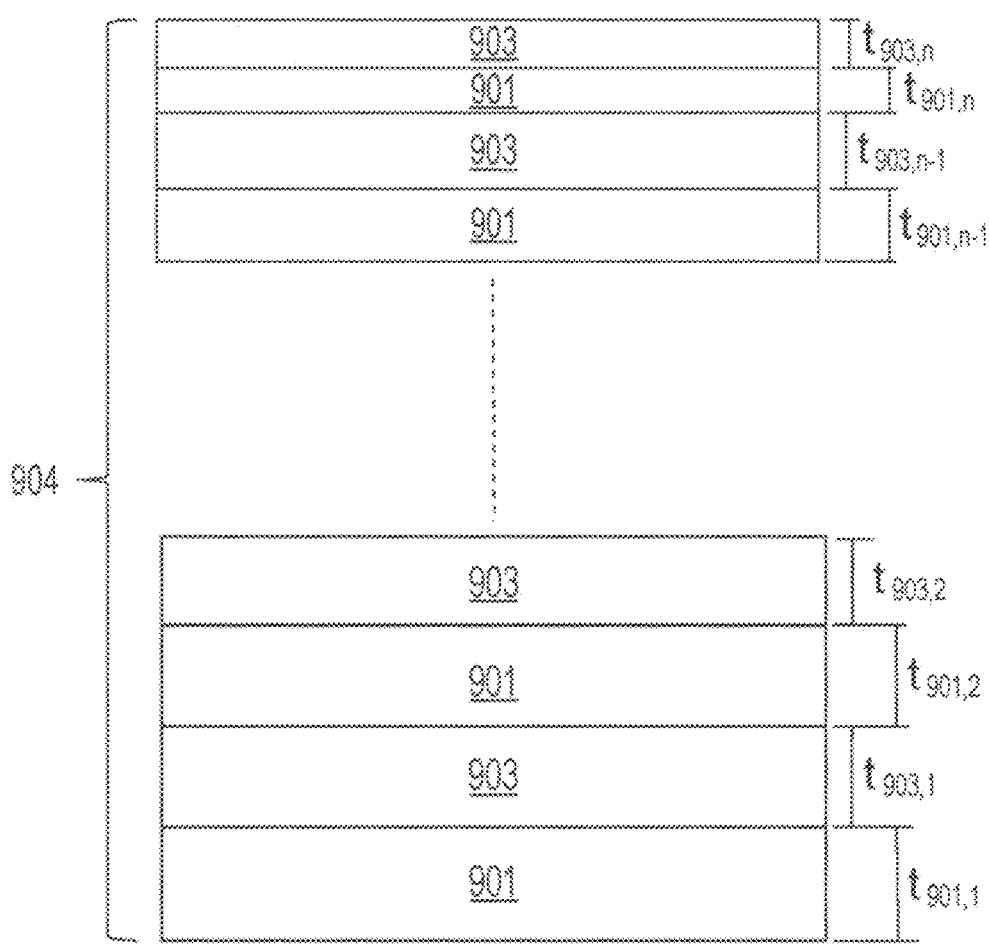
FIG. 9 shows a schematic cross section of a semiconductor edge filter in accordance with an embodiment of the present invention.

FIG. 9 illustrates an example for a design of a semiconductor edge filter. In one embodiment, the semiconductor edge filter 904 comprises two lattice-matched or pseudomorphic semiconductor materials with differing refractive indices. As an example, semiconductor 904 can comprise alternating layers of layer 901 and layer 903, layer 901 having a first composition and a first refractive index and layer 903 having a second composition and second refractive index, with an adjacent layer 901 and layer 903 providing a layer pair. A layer pair can comprise a first layer comprising GaAs and a second layer comprising AlGaAs. A layer pair can comprise a first layer comprising $Al_xGa_{1-x}As$ and a second layer comprising $Al_yGa_{1-y}As$, where $0 \le x \le 1$, and $0 \le y \le 1$, and the values of x and y are chosen to be different. It will be understood that a semiconductor edge filter may have more than two different semiconductor materials forming the multilayer structure, each layer having a different composition and a different refractive index.

The refractive index step available between semiconductor materials is smaller than for dielectric materials. Consequently, the number of semiconductor layers (and their thicknesses) required to produce desired reflectivity and transmission characteristics will differ significantly from designs using different materials such as dielectrics.

A semiconductor edge filter comprises at least 20-layer pairs (40 layers). A semiconductor edge filter can comprise, for example from 20 to 100 layers pairs, or from 30 to 50-layer pairs. For example, in semiconductor edge filter 904, the first layer pair has corresponding thicknesses $t_{901,1}$ and $t_{903,1}$. The second layer pair has corresponding thicknesses $t_{901,2}$ and $t_{903,1}$. The $n^{th}$ mirror pair has corresponding thicknesses $t_{901,n}$ and $t_{903,n}$.

The optical thicknesses for the different layers are not periodic and do not vary monotonically. Individual layer thicknesses can vary between about 5 nm and 1,300 nm or between about 10 nm and 1,000 nm, or between about 5 nm and 250 nm, in order to achieve desired reflectivity and transmission characteristics.

Such a semiconductor edge filter stack can be grown by either molecular beam epitaxy (MBE) or by metal-organic chemical vapor deposition (MOCVD). Optimized high doping can reduce electrical resistance (a well-understood process in VCSEL technology for DBRs) and can maintain optical transparency for light absorbed by an underlying (Si,Sn)Ge junction in a solar cell. The interfaces between adjacent layers may de delta doped, for example. The interfaces may also have a graded composition over a thin thickness, transitioning from the composition of one layer to the composition of the adjacent layer. The composition grading can be achieved using thin layers, typically about 1 or 2 nm thick. For example, an interface between GaAs and AlAs layers could be graded by thin layers of $Al_{0.2}Ga_{0.8}As$, and $Al_{0.8}Ga_{0.2}As$. Grading of the composition can benefit electrical performance of the semiconductor edge filter, without adversely affecting the optical properties.

A basic long-wave pass edge filter can be designed using periodic layers according to the design rule $[0.5H (LH)^n L 0.5H]$ where H and L are the quarter-wavelength optical thicknesses of the high and low refractive index materials, respectively, and n is the number of repeating units. However, such edge filters are characterized by significant ripples in the passband. There is no analytical solution possible for the design of a semiconductor edge filter having a high reflectivity in a first wavelength range, a high transmission in a second wavelength range, minimal ripples in the high transmission band, and having a well-defined cutoff wavelength between the high reflection and high transmission bands. Furthermore, the refractive index step between semiconductor materials can limit the bandwidth of the high reflectivity region. Semiconductor edge filters of the present invention have non-periodic structures, with no or minimal ripples in the passband. While the above-mentioned design rule can serve as a starting point, changes to the layer thicknesses and the addition of layers within specific points of the structure, are necessary to achieve the desired optical characteristics of the edge filter. The difference between the desired filter spectral characteristic and the actual filter spectral characteristic for a given design can be measured using a merit function. One technique to achieve this is needle synthesis. In this technique, a thin layer (or needle) of material is moved through a design and inserted at the point where a merit function is most improved. This can be repeated iteratively in order to modify the number of layers and the thicknesses of the layers to minimize the merit function and to yield the desired spectral response.

Semiconductor edge filters disclosed by the invention are configured to provide a reflectivity of greater than 80% or greater than 90% or greater than 95% in a first wavelength range. Semiconductor edge filters disclosed by the invention are configured to provide transmission of greater than 95% or greater than 98% or greater than 99% in a second wavelength range that occurs at wavelengths longer than the first wavelength range. The full-width half-maximum for the reflectivity in the first wavelength rage is greater than 100 nm or greater than 150 nm or greater than 200 nm. A lower wavelength limit of the high reflectivity region can be defined by the point at which there is no optical absorption within the semiconductor materials from which the edge filter is formed, or some other design wavelength longer that the short-wavelength absorption limit, and the upper wavelength limit can be chosen based on the desired application and bandwidth of light for which high reflectivity is desired, such as the absorption spectrum for a cell in a multijunction solar cell, or the absorption spectrum for an absorber layer in a photodetector. The second wavelength range for high transmission can be greater than 500 nm or greater than 750 nm. The wavelength transition range between high reflectivity and high transmission can be less than 40 nm, or less than 20 nm, or less than 10 nm.

Tables 1 and 2 show layer thicknesses for two different GaAs/Al$_{0.9}$Ga$_{0.1}$As semiconductor edge filters designed with a filter edge at 1.09 eV. In Table 1, the minimum layer thickness is about 10 nm and the maximum layer thickness is about 910 nm, and the total filter thickness is about 7.3 microns. The thickness of the structure shown in Table 2 is about 8.8 microns.

TABLE 1

Material and physical thickness (nm) for an edge filter designed with a cut-off at about 1.09 eV.

| No. | Layer type | Thickness (nm) |
|---|---|---|
| 1 | Al$_{0.9}$Ga$_{0.1}$As | 106.28 |
| 2 | GaAs | 10.6 |
| 3 | Al$_{0.9}$Ga$_{0.1}$As | 149.98 |

TABLE 1-continued

Material and physical thickness (nm) for an edge filter designed with a cut-off at about 1.09 eV.

| No. | Layer type | Thickness (nm) |
|---|---|---|
| 4 | GaAs | 61.03 |
| 5 | Al$_{0.9}$Ga$_{0.1}$As | 912.11 |
| 6 | GaAs | 65.41 |
| 7 | Al$_{0.9}$Ga$_{0.1}$As | 79.88 |
| 8 | GaAs | 73.05 |
| 9 | Al$_{0.9}$Ga$_{0.1}$As | 86.7 |
| 10 | GaAs | 76.79 |
| 11 | Al$_{0.9}$Ga$_{0.1}$As | 91.23 |
| 12 | GaAs | 78.62 |
| 13 | Al$_{0.9}$Ga$_{0.1}$As | 90.44 |
| 14 | GaAs | 76.92 |
| 15 | Al$_{0.9}$Ga$_{0.1}$As | 89.35 |
| 16 | GaAs | 78.96 |
| 17 | Al$_{0.9}$Ga$_{0.1}$As | 91.33 |
| 18 | GaAs | 77.25 |
| 19 | Al$_{0.9}$Ga$_{0.1}$As | 90.43 |
| 20 | GaAs | 76.56 |
| 21 | Al$_{0.9}$Ga$_{0.1}$As | 92.44 |
| 22 | GaAs | 78.56 |
| 23 | Al$_{0.9}$Ga$_{0.1}$As | 91.73 |
| 24 | GaAs | 76.13 |
| 25 | Al$_{0.9}$Ga$_{0.1}$As | 91.09 |
| 26 | GaAs | 78.17 |
| 27 | Al$_{0.9}$Ga$_{0.1}$As | 93.68 |
| 28 | GaAs | 78.81 |
| 29 | Al$_{0.9}$Ga$_{0.1}$As | 91.37 |
| 30 | GaAs | 76.28 |
| 31 | Al$_{0.9}$Ga$_{0.1}$As | 91.5 |
| 32 | GaAs | 78.8 |
| 33 | Al$_{0.9}$Ga$_{0.1}$As | 92.96 |
| 34 | GaAs | 77.77 |
| 35 | Al$_{0.9}$Ga$_{0.1}$As | 90.56 |
| 36 | GaAs | 76.81 |
| 37 | Al$_{0.9}$Ga$_{0.1}$As | 92.31 |
| 38 | GaAs | 78.59 |
| 39 | Al$_{0.9}$Ga$_{0.1}$As | 92.34 |
| 40 | GaAs | 77.25 |
| 41 | Al$_{0.9}$Ga$_{0.1}$As | 91.45 |
| 42 | GaAs | 78 |
| 43 | Al$_{0.9}$Ga$_{0.1}$As | 92.71 |
| 44 | GaAs | 78.01 |
| 45 | Al$_{0.9}$Ga$_{0.1}$As | 91.11 |
| 46 | GaAs | 76.48 |
| 47 | Al$_{0.9}$Ga$_{0.1}$As | 91.58 |
| 48 | GaAs | 79.18 |
| 49 | Al$_{0.9}$Ga$_{0.1}$As | 93.07 |
| 50 | GaAs | 78.32 |
| 51 | Al$_{0.9}$Ga$_{0.1}$As | 90.4 |
| 52 | GaAs | 76.55 |
| 53 | Al$_{0.9}$Ga$_{0.1}$As | 89.52 |
| 54 | GaAs | 78.12 |
| 55 | Al$_{0.9}$Ga$_{0.1}$As | 92.16 |
| 56 | GaAs | 80.9 |
| 57 | Al$_{0.9}$Ga$_{0.1}$As | 89.94 |
| 58 | GaAs | 76.37 |
| 59 | Al$_{0.9}$Ga$_{0.1}$As | 86.77 |
| 60 | GaAs | 83.81 |
| 61 | Al$_{0.9}$Ga$_{0.1}$As | 81.38 |
| 62 | GaAs | 73.16 |
| 63 | Al$_{0.9}$Ga$_{0.1}$As | 69.04 |
| 64 | GaAs | 24.86 |
| 65 | Al$_{0.9}$Ga$_{0.1}$As | 10.34 |
| 66 | GaAs | 23.17 |
| 67 | Al$_{0.9}$Ga$_{0.1}$As | 37.04 |
| 68 | GaAs | 25.8 |
| 69 | Al$_{0.9}$Ga$_{0.1}$As | 149.42 |
| 70 | GaAs | 24.97 |
| 71 | Al$_{0.9}$Ga$_{0.1}$As | 121.73 |
| 72 | GaAs | 55.7 |
| 73 | Al$_{0.9}$Ga$_{0.1}$As | 109.7 |
| 74 | GaAs | 65.5 |
| 75 | Al$_{0.9}$Ga$_{0.1}$As | 83.13 |
| 76 | GaAs | 79.94 |
| 77 | Al$_{0.9}$Ga$_{0.1}$As | 91.75 |

TABLE 1-continued

Material and physical thickness (nm) for an edge filter designed with a cut-off at about 1.09 eV.

| No. | Layer type | Thickness (nm) |
|---|---|---|
| 78 | GaAs | 80.64 |
| 79 | $Al_{0.9}Ga_{0.1}As$ | 80.03 |
| 80 | GaAs | 63.76 |
| 81 | $Al_{0.9}Ga_{0.1}As$ | 84.58 |

TABLE 2

Material and physical thickness (nm) for an edge filter designed with a cut-off at about 1.09 eV.

| No. | Layer type | Thickness (nm) |
|---|---|---|
| 1 | $Al_{0.9}Ga_{0.1}As$ | 50.15 |
| 2 | GaAs | 59.81 |
| 3 | $Al_{0.9}Ga_{0.1}As$ | 84.46 |
| 4 | GaAs | 65.78 |
| 5 | $Al_{0.9}Ga_{0.1}As$ | 72.82 |
| 6 | GaAs | 69.52 |
| 7 | $Al_{0.9}Ga_{0.1}As$ | 81.58 |
| 8 | GaAs | 67.97 |
| 9 | $Al_{0.9}Ga_{0.1}As$ | 79.76 |
| 10 | GaAs | 70.6 |
| 11 | $Al_{0.9}Ga_{0.1}As$ | 81.12 |
| 12 | GaAs | 68.34 |
| 13 | $Al_{0.9}Ga_{0.1}As$ | 81.23 |
| 14 | GaAs | 70.5 |
| 15 | $Al_{0.9}Ga_{0.1}As$ | 81.41 |
| 16 | GaAs | 69.13 |
| 17 | $Al_{0.9}Ga_{0.1}As$ | 82.2 |
| 18 | GaAs | 70.13 |
| 19 | $Al_{0.9}Ga_{0.1}As$ | 81.28 |
| 20 | GaAs | 68.8 |
| 21 | $Al_{0.9}Ga_{0.1}As$ | 82.2 |
| 22 | GaAs | 69.66 |
| 23 | $Al_{0.9}Ga_{0.1}As$ | 81 |
| 24 | GaAs | 68.6 |
| 25 | $Al_{0.9}Ga_{0.1}As$ | 81.38 |
| 26 | GaAs | 68.28 |
| 27 | $Al_{0.9}Ga_{0.1}As$ | 78.41 |
| 28 | GaAs | 66.72 |
| 29 | $Al_{0.9}Ga_{0.1}As$ | 76.97 |
| 30 | GaAs | 64.04 |
| 31 | $Al_{0.9}Ga_{0.1}As$ | 69.54 |
| 32 | GaAs | 61.21 |
| 33 | $Al_{0.9}Ga_{0.1}As$ | 66.02 |
| 34 | GaAs | 58.84 |
| 35 | $Al_{0.9}Ga_{0.1}As$ | 69.6 |
| 36 | GaAs | 64.38 |
| 37 | $Al_{0.9}Ga_{0.1}As$ | 74.66 |
| 38 | GaAs | 66.49 |
| 39 | $Al_{0.9}Ga_{0.1}As$ | 79.75 |
| 40 | GaAs | 67.73 |
| 41 | $Al_{0.9}Ga_{0.1}As$ | 80.2 |
| 42 | GaAs | 68.77 |
| 43 | $Al_{0.9}Ga_{0.1}As$ | 82.38 |
| 44 | GaAs | 68.87 |
| 45 | $Al_{0.9}Ga_{0.1}As$ | 81.32 |
| 46 | GaAs | 69.46 |
| 47 | $Al_{0.9}Ga_{0.1}As$ | 82.8 |
| 48 | GaAs | 69.09 |
| 49 | $Al_{0.9}Ga_{0.1}As$ | 80.36 |
| 50 | GaAs | 69.24 |
| 51 | $Al_{0.9}Ga_{0.1}As$ | 79.39 |
| 52 | GaAs | 68.32 |
| 53 | $Al_{0.9}Ga_{0.1}As$ | 72.93 |
| 54 | GaAs | 53.21 |
| 55 | $Al_{0.9}Ga_{0.1}As$ | 60.96 |
| 56 | GaAs | 29.09 |
| 57 | $Al_{0.9}Ga_{0.1}As$ | 80.18 |
| 58 | GaAs | 45.22 |
| 59 | $Al_{0.9}Ga_{0.1}As$ | 85.06 |
| 60 | GaAs | 67.46 |
| 61 | $Al_{0.9}Ga_{0.1}As$ | 79.38 |
| 62 | GaAs | 68.14 |
| 63 | $Al_{0.9}Ga_{0.1}As$ | 82.07 |
| 64 | GaAs | 70.59 |
| 65 | $Al_{0.9}Ga_{0.1}As$ | 82 |
| 66 | GaAs | 68.95 |
| 67 | $Al_{0.9}Ga_{0.1}As$ | 82.16 |
| 68 | GaAs | 70.29 |
| 69 | $Al_{0.9}Ga_{0.1}As$ | 81.54 |
| 70 | GaAs | 68.81 |
| 71 | $Al_{0.9}Ga_{0.1}As$ | 80.85 |
| 72 | GaAs | 71.68 |
| 73 | $Al_{0.9}Ga_{0.1}As$ | 78.71 |
| 74 | GaAs | 54.61 |
| 75 | $Al_{0.9}Ga_{0.1}As$ | 89.9 |
| 76 | GaAs | 26.55 |
| 77 | $Al_{0.9}Ga_{0.1}As$ | 63.78 |
| 78 | GaAs | 31.86 |
| 79 | $Al_{0.9}Ga_{0.1}As$ | 84.48 |
| 80 | GaAs | 58.76 |
| 81 | $Al_{0.9}Ga_{0.1}As$ | 79.91 |
| 82 | GaAs | 71.65 |
| 83 | $Al_{0.9}Ga_{0.1}As$ | 78.78 |
| 84 | GaAs | 69.29 |
| 85 | $Al_{0.9}Ga_{0.1}As$ | 82.51 |
| 86 | GaAs | 70.59 |
| 87 | $Al_{0.9}Ga_{0.1}As$ | 80.49 |
| 88 | GaAs | 69.53 |
| 89 | $Al_{0.9}Ga_{0.1}As$ | 82.16 |
| 90 | GaAs | 70.58 |
| 91 | $Al_{0.9}Ga_{0.1}As$ | 80.09 |
| 92 | GaAs | 56.85 |
| 93 | $Al_{0.9}Ga_{0.1}As$ | 120.33 |
| 94 | GaAs | 28.62 |
| 95 | $Al_{0.9}Ga_{0.1}As$ | 137.2 |
| 96 | GaAs | 29.49 |
| 97 | $Al_{0.9}Ga_{0.1}As$ | 147.7 |
| 98 | GaAs | 24.87 |
| 99 | $Al_{0.9}Ga_{0.1}As$ | 126.34 |
| 100 | GaAs | 43.37 |
| 101 | $Al_{0.9}Ga_{0.1}As$ | 103.36 |
| 102 | GaAs | 51.87 |
| 103 | $Al_{0.9}Ga_{0.1}As$ | 97.92 |
| 104 | GaAs | 55.75 |
| 105 | $Al_{0.9}Ga_{0.1}As$ | 96.21 |
| 106 | GaAs | 45.13 |
| 107 | $Al_{0.9}Ga_{0.1}As$ | 123.12 |
| 108 | GaAs | 34.67 |
| 109 | $Al_{0.9}Ga_{0.1}As$ | 117.15 |
| 110 | GaAs | 32.22 |
| 111 | $Al_{0.9}Ga_{0.1}As$ | 136.96 |
| 112 | GaAs | 13.98 |
| 113 | $Al_{0.9}Ga_{0.1}As$ | 174.62 |
| 114 | GaAs | 16.4 |
| 115 | $Al_{0.9}Ga_{0.1}As$ | 133.66 |
| 116 | GaAs | 25.27 |
| 117 | $Al_{0.9}Ga_{0.1}As$ | 134.02 |
| 118 | GaAs | 17.7 |
| 119 | $Al_{0.9}Ga_{0.1}As$ | 137.98 |
| 120 | GaAs | 38.99 |
| 121 | $Al_{0.9}Ga_{0.1}As$ | 54.68 |

A semiconductor edge filter can be situated below or above a tunnel junction. When situated below a tunnel junction, the semiconductor edge filter can be n-type and when situated above a tunnel junction a semiconductor edge filter can be p-type.

The absorption spectrum for a junction such as a dilute nitride junction can be between 300 nm and 400 nm wide. Conventional DBRs are inadequate for providing reflection over the entire absorption range of an underlying junction and are typically limited to a wavelength range less than 150 nm. This can reduce the effectiveness of the DBR at improving the current produced by the cell. A semiconductor edge filter can increase the reflectivity bandwidth to greater than 150 nm or to greater than 200 nm.

While the interfaces between adjacent layers in a semiconductor edge filter may be delta doped, or the interfaces may have a graded composition over a thin thickness, transitioning from the composition of one layer to the composition of the adjacent layer, this is not shown. A layer can comprise sub-layers, with different elemental composition, different doping level and/or different refractive index, without degrading the optical performance of the semiconductor edge filter.

The long-wavelength cutoff wavelength for the high reflectivity band of the semiconductor edge filter can be adjusted by selecting the materials and thicknesses of the interlayers forming the semiconductor edge filter. For a dilute nitride such as GaInNAsSb, GaInNAsBi, and GaInNAsSbBi suitable for use in solar cells, depending on the band gap of the material, the long wavelength cutoff for the high reflectivity band of the semiconductor edge filter can be at a wavelength within a range, for example, from 1,000 nm (1.240 eV) to 1,400 nm (0.885 eV), from 1,000 nm (1.240 eV) to 1,300 nm (0.954 eV), from 1,000 nm (1.240 eV) to 1,200 nm (1.033 eV), or from 1,100 nm (1.127 eV) to 1,200 nm (1.033 eV), or from 1,050 nm (1.18 eV) to 1,150 nm (1.078 eV). The long wavelength cutoff of the semiconductor edge filter can be at a wavelength within 50 nm or within 25 nm or within 10 nm from the long-wavelength absorption cutoff of the overlying (dilute nitride) subcell.

The FWHM for the high reflectivity spectrum of the first wavelength range of the semiconductor edge filter can be greater than 100 nm, or greater than 150 nm or 200 nm, or greater than 250 nm.

Figure 10A:
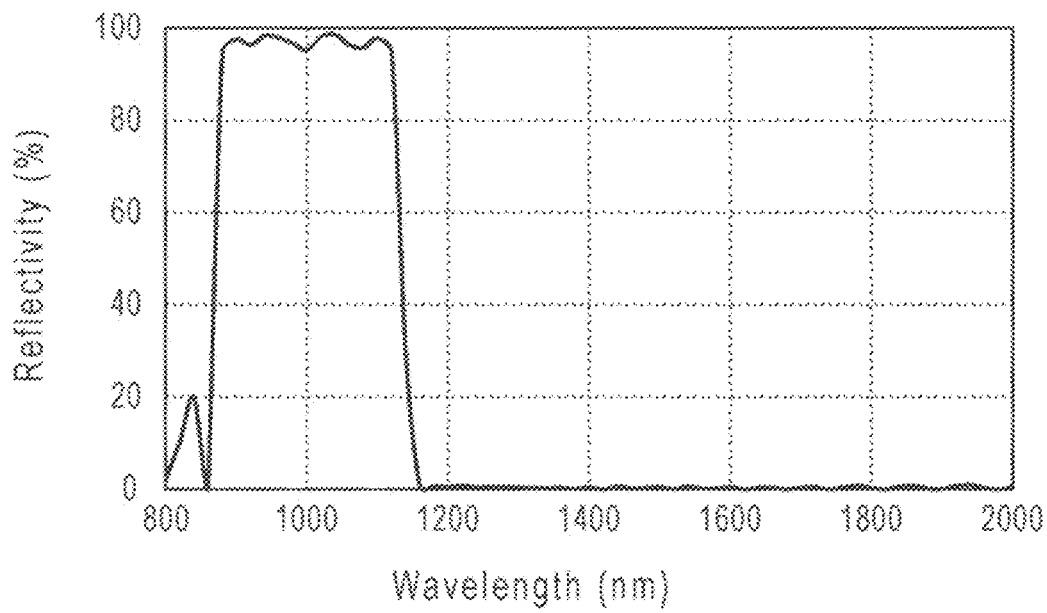
FIG. 10A shows a reflectivity spectrum for a semiconductor edge filter according to the present invention.
Figure 10B:
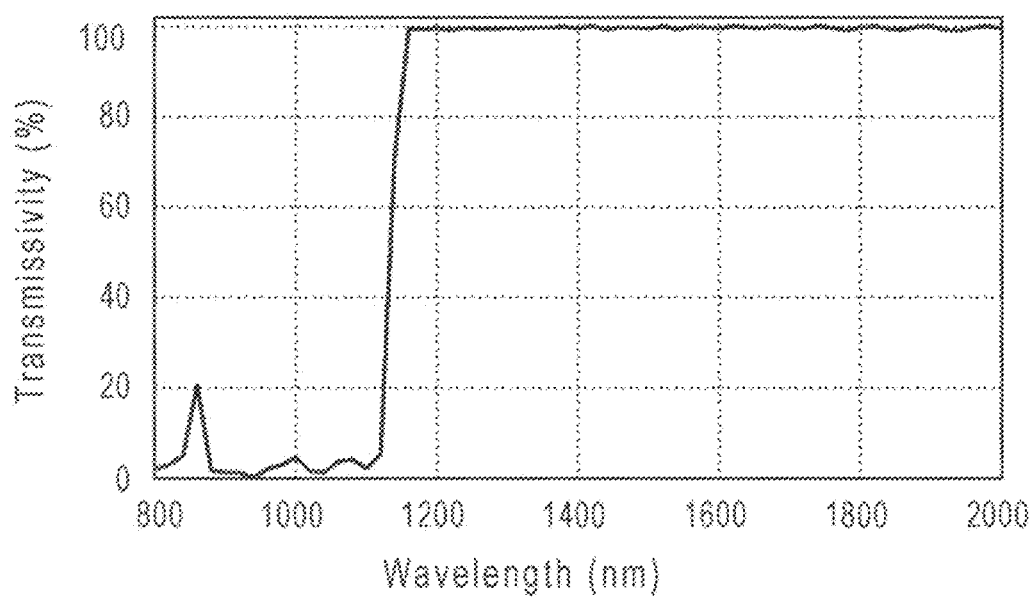
FIG. 10B shows a transmission spectrum for a semiconductor edge filter according to the present invention.

FIGS. 10A and 10B shows the modeled reflectivity and transmission spectra for a semiconductor edge filter at normal incidence, with layer thicknesses according to the example in Table 1. The filter was designed to have an edge at approximately 1.09 eV (between 1130 nm and 1140 nm), corresponding to the band edge of an overlying dilute nitride junction.

FIG. 10A shows a high reflectivity region between about 880 nm and about 1120 nm, with a full width half maximum of about 240 nm. The reflectivity is at least 90% within this range, and at least 95% over a wavelength range of about 200 nm. The ability to provide reflectivity across a broader wavelength range than can be achieved using conventional DBRs is important, as it can increase the spectral responsivity of a device such as a photodetector or the absorption in a junction of a photovoltaic cell across a broader wavelength range. At wavelengths longer than about 1140 nm, the reflectivity falls to less than 1%.

FIG. 10B shows a high transmission region for wavelength greater than about 1140 nm. The transmission for this example is greater than 99% for all wavelengths longer than about 1160 nm.

The transition between high reflectivity and high transmission occurs in a narrow wavelength range of about 40 nm or less, and the structure allows both high reflectivity and high transmission regions, without compromising or reducing the reflectivity or transmission values within those ranges.

Integration of a semiconductor edge filter into a multijunction solar cell is advantageous when the overlying junction comprises a material with a low diffusion length, or when the minority carrier diffusion length of the junction substantially deteriorates during its operational lifetime. Device deterioration is unavoidable in solar cells that are deployed into space and exposed to highly energetic particles. Radiation damage causes the diffusion length in a junction to decrease such that only a portion of the generated minority carriers reach the depletion layer. Consequently, such deterioration decreases the maximum capabilities and lifetime of a spacecraft powered by dilute nitride-containing multijunction solar cells. With a semiconductor edge filter, the thickness of an overlying dilute nitride junction can be reduced without compromising optical absorption in the dilute nitride junction. The semiconductor edge filter effectively decouples the effects of the optical thickness from the physical thickness. The combination of introducing a semiconductor edge filter and simultaneously reducing the dilute nitride junction thickness has a positive effect on current generation. A more advantageous current generation profile throughout the depth of the active layer of a dilute nitride junction can be achieved. It is particularly significant that the average distance of the generated minority carriers to the depletion layer is significantly reduced due to the reduced dilute nitride junction thickness. This leads to an increased probability that the minority carriers will encounter the depletion layer during diffusion and will thus contribute to the current collected at the contacts. By using an underlying semiconductor edge filter, a thinner dilute nitride third junction (J3) in a 4J solar cell can be used and thereby improve carrier collection under beginning-of-life (BOL) and end-of-life (EOL) conditions due to reduced diffusion length for carrier collection.

A semiconductor layer provided by the present disclosure can be designed to improve the performance of an overlying dilute nitride layer such as a dilute nitride junction thereby improving the performance of a device such as a multijunction solar cell comprising the dilute nitride layer and underlying semiconductor edge filter. A semiconductor edge filter layer provided by the present disclosure can be designed (1) reflect light capable of being absorbed by the dilute nitride junction back into the overlying dilute nitride layer and (2) transmit light at wavelengths that can be absorbed by an underlying junction.

A semiconductor edge filter layer provided by the present disclosure can be designed to reduce the thickness of an overlying dilute layer such as a dilute nitride junction, allowing improved carrier collection thereby improving the performance of a device such as a multijunction solar cell comprising the dilute nitride layer and underlying semiconductor edge filter layer, as will be described later.

A semiconductor layer provided by the present disclosure can be designed to improve the performance of an overlying (Al,In)GaAs layer such as a (Al,In)GaAs junction or subcell thereby improving the performance of a device such as a multijunction solar cell comprising the (Al,In)GaAs layer and underlying semiconductor edge filter. A semiconductor edge filter layer provided by the present disclosure can be designed (1) reflect light capable of being absorbed by the (Al,In)GaAs junction back into the overlying (Al,In)GaAs junction and (2) transmit light at wavelengths that can be absorbed by an underlying junction, or underlying junctions.

A semiconductor edge filter layer provided by the present disclosure can be designed to reduce the thickness of an (Al,In)GaAs layer such as a (Al,In)GaAs junction or subcell, allowing improved carrier collection thereby improving the performance of a device such as a multijunction solar cell comprising the (Al,In)GaAs layer and underlying semiconductor edge filter layer.

Several structures have been simulated for comparison purposes to assess the impact of semiconductor edge filters on performance of the junctions in a solar cell. A baseline 4J structure with a dilute nitride (J3) thickness of 2.5 µm was simulated. A 4J structure with a thinner (1.5 µm thick) dilute nitride absorbing region was then simulated with and without a semiconductor edge filter between J3 and J4 (Ge). The semiconductor edge filter was designed using GaAs/$Al_{0.9}Ga_{0.1}$As layers to have a cutoff wavelength at an energy of about 1.09 eV, corresponding to a wavelength between 1130 and 1140 nm, and matching the band edge of the overlying dilute nitride layer, as described in Table 1.

Table 3 shows the calculated J3 and J4 current densities of a 4J solar cell for an AM0 source. The baseline structure has a thickness for J3 of 2.5 µm, and the thinner structure has a thickness of 1.5 µm. Thinning the J3 junction from 2.5 µm to 1.5 µm reduces its current density by 14%, which can make it the current limiting cell in a 4-junction cell, while short circuit current of J4 increases by 10%. With the thinner J3 junction, the semiconductor edge filter restores the J3 current to near its previous value for the baseline design (about 2 mA/cm$^2$ higher than for the thin J3 junction), while reducing the J4 short circuit current density by about 1.3 mA/cm$^2$ (or about 6%) compared to the baseline design. However, because J4 has excess current, this loss can be tolerated without degrading the overall performance of the multijunction cell. The reduction in current density in J4 can be attributed to higher absorption efficiency at wavelengths that are absorbed in the overlying J3 junction that would otherwise be transmitted into J4 and be absorbed there.

TABLE 3

Calculated J3 and J4 current densities of a 4J solar cell for an AM0 source.

| Filter type | J3 thickness (µm) | J3 current density (mA/cm$^2$) | J4 current density (mA/cm$^2$) |
| --- | --- | --- | --- |
| None | 2.5 | 16.2 | 20.9 |
| None | 1.5 | 13.9 | 23.1 |
| Edge filter, 1140 nm design wavelength | 1.5 | 15.9 | 19.6 |

Table 4 shows the calculated J3 and J4 current densities of another 4J solar cell for an AM0 source. In this example, the bandgap for the dilute nitride (J3) absorber is 1.08 eV. The baseline structure has a J3 thickness of 2.5 µm, and the thinner structure has a J3 thickness of 1.5 µm. The edge filter was designed using GaAs/$Al_{0.9}Ga_{0.1}$As layers to have a cutoff wavelength at an energy of 1.08 eV, corresponding to a wavelength of about 1150 nm, and matching the band edge of the overlying dilute nitride layer.

TABLE 4

Calculated J3 and J4 current densities of a 4J solar cell for an AM0 source.

| Filter type | J3 thickness (µm) | J3 current density (mA/cm$^2$) | J4 current density (mA/cm$^2$) |
| --- | --- | --- | --- |
| None | 2.5 | 16.3 | 19.2 |
| None | 1.5 | 13.8 | 21.5 |
| Edge filter, 1150 nm design wavelength | 1.5 | 16.6 | 17.6 |

The short circuit current densities for the top cell (J1), and the second cell (J2) were calculated to be 16.2 mA/cm$^2$ and 16.4 mA/cm$^2$, respectively. Thinning the J3 junction from 2.5 µm to 1.5 µm reduces the current density in J3, making it the current limiting cell, while J4's short circuit current increases. In this design, the semiconductor edge filter restores the J3 current to just above its original value for the baseline design, indicating further thinning of the J3 layer can be possible. Although the J4 short circuit current is reduced compared to the baseline design, this loss can be tolerated without degrading the overall performance of the multijunction cell since J4 has excess current. The reduction in current density in J4 can be attributed to higher absorption efficiency at wavelengths that are absorbed in the overlying J3 junction that would otherwise be transmitted into J4 and be absorbed there.

Figure 13:
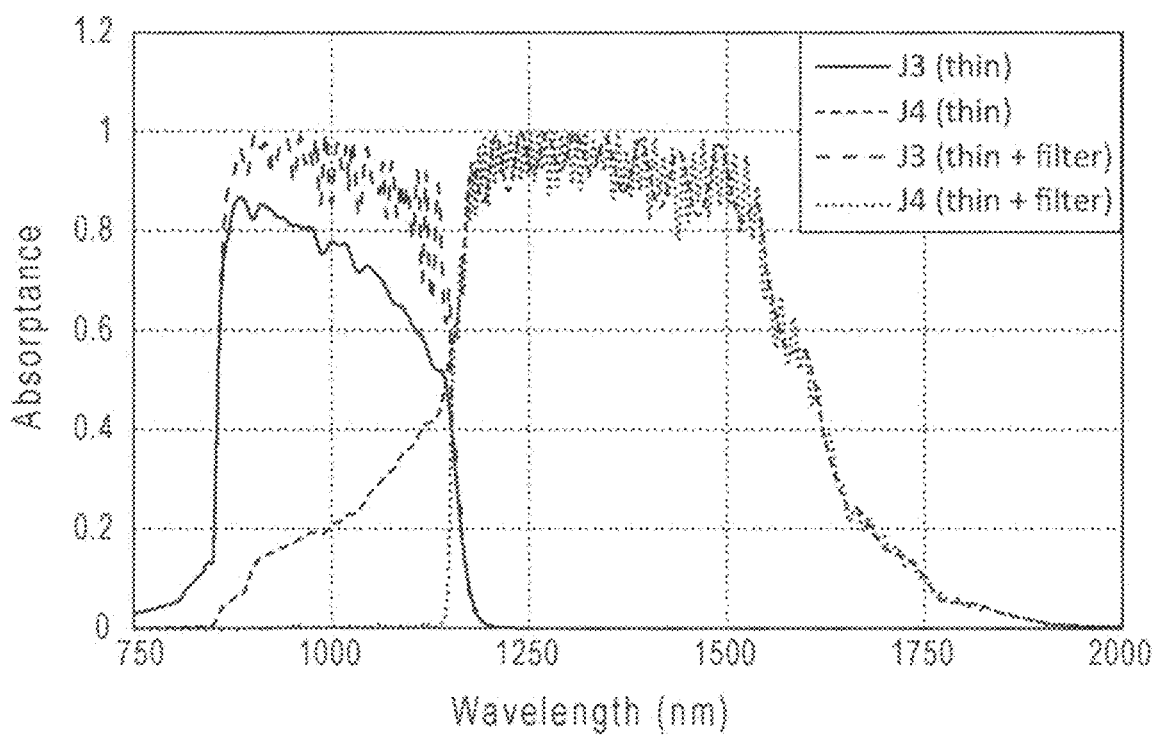
FIG. 13 shows the simulated wavelength-dependent quantum efficiency for a dilute nitride J3 junction and the (Si,Sn)Ge J4 junction of a 4J solar cell, with and without a semiconductor edge filter between the dilute nitride J3 junction and the (Si,Sn)Ge J4 junction.

FIG. 13 shows the simulated wavelength-dependent absorptance for Junction 3 (J3, dilute nitride) and Junction 4 (J4, Ge) 4J solar cells with and without a semiconductor edge filter between the dilute nitride J3 junction and the (Si,Sn)Ge J4 junction, with 1.5 µm thick J3, corresponding to the device with results shown in Table 4. It can be seen that the absorptance for J3 in the design with the semiconductor edge filter is greater than for the design without the semiconductor edge filter for all wavelengths, confirming the semiconductor edge filter reflects across the entire absorption spectrum of the dilute nitride layer. Without the semiconductor edge filter, the effect of thinning J3 results in a broader absorptance spectrum for J4, for light at wavelengths that are not well absorbed by the thinner J3, but this short wavelength tail for J4 is eliminated by the semiconductor edge filter. For the device with the 2.5 µm J3 layer, and without the edge filter, there is also a short wavelength absorptance tail below 1150 nm. The edge filter eliminates this tail, and for wavelengths beyond 1150 nm, the absorptance in J4 is comparable with the baseline design, with small wavelength-dependent variations with respect to the baseline design that are lesser than the ripple-induced effects caused by a conventional DBR.

Figure 14:
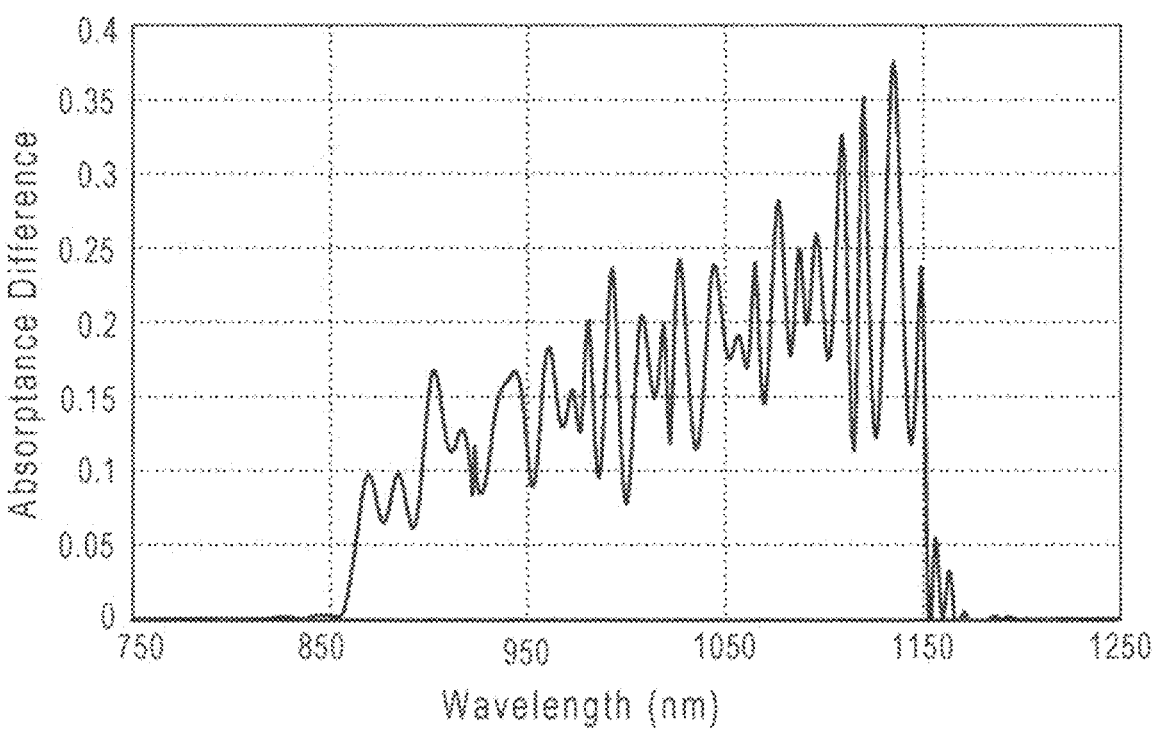
FIG. 14 shows the simulated wavelength dependent absorption difference for J3 for the simulation results shown in FIG. 13.

The difference in J3 absorptance between the two designs is shown in FIG. 14. It can be seen that the semiconductor edge filter has increased absorptance across the wavelength range between approximately 850 nm and 1150 nm, indicating a reflectivity bandwidth of the semiconductor edge filter for the first wavelength range of approximately 300 nm.

The transmission characteristic of the semiconductor edge filter can also minimize or eliminate ripples in the absorptance that might otherwise occur for the wavelength range absorbed by the underlying layer when a structure such as a DBR is used. This can effectively maintain the shape of the spectral responsivity for the underlying absorbing layer of a device such as a multicolor photodetector.

In some embodiments, the dilute nitride layer of a baseline structure comprises a first unintentionally doped (UID) region having a first thickness and an unintentional doping concentration less than about $1 \times 10^{15}/cm^3$, and a second p-doped dilute nitride region having a second thickness and a dopant concentration that can vary as a function of position between $1 \times 10^{15}/cm^3$ and $1 \times 10^{19}/cm^3$, wherein the thickness of the second region is greater than the thickness of the first region. In one embodiment, the thickness of the UID region is 1 µm and the thickness of the p-doped region is 1.5 µm. As has been described, the semiconductor edge filter allows the thickness of the dilute nitride layer to be thinned from 2.5 µm to a thickness of 1.5 µm for an exemplary embodiment of the invention. In some embodiments, the semiconductor edge filter allows the thickness of the dilute nitride layer to be reduced by up to 1.5 µm to between 0.5 µm and 3 µm. In some embodiments, this thinning can be applied in a proportional manner to the UID region and the doped region. In some embodiments, the thinning can be applied in a non-proportional manner, where the reduced thickness of the UID region is thinner that the reduced thickness of the p-doped region. In other embodiments, the thinning can be applied preferentially to the p-doped region, such that the thickness of the UID region is greater than or equal to the thickness of the p-doped region. For example, for a nitride layer thickness of 1.5 μm, the thickness of the UID region can be μm and the thickness of the p-type doped region can be 0.5 μm, with all the thinning applied to the p-doped region, or the thickness of the UID region can be 0.8 μm and the thickness of the p-type doped region can be 0.7 μm. In some embodiments, the thickness of the UID region is between 0.3 μm and 1.5 μm, and the thickness of the p-doped region is between 0.1 μm and 1.5 μm, where the thickness of the UID region is greater than or equal to the thickness of the p-doped region. Preferentially thinning the p-type region is beneficial for current collection. Reflectivity by the semiconductor edge filter allows a thinner p-doped region to be used and allows more light absorption to occur closer to the UID region and its interface with the p-doped region. Greater absorption closer to the junction of the dilute nitride subcell results in improved carrier collection efficiency, thereby increasing the short circuit current and increasing the efficiency of the subcell.

A semiconductor edge filter layer provided by the present disclosure can be designed to allow the bandgap of an overlying dilute nitride layer such as a dilute nitride junction to be changed or increased by changing the material composition, for example by reducing the nitrogen content, over at least a portion of the dilute nitride layer. Reducing the nitrogen content can provide improved quality material at the expense of long-wavelength absorption. Material composition can also be changed by changing the indium content or by changing the Sb content. The semiconductor edge filter can compensate for the reduced absorption by reflecting light over a broader wavelength range back into the junction so that it can be absorbed and generate photocurrent.

The bandgap of the dilute nitride can be increased by between 2 meV and 100 meV. The bandgap of the dilute nitride can be increased by between 2 meV and 50 meV. In some embodiments, the bandgap of both the UID layer and the p-doped layer can be increased. In some embodiments, the bandgap of just the p-doped layer can be increased. In some embodiments, more than one bandgap increase can be implemented, for example, two bandgap increases can be applied to different portions of the p-doped region, wherein the sum of the two bandgap increases is between 2 meV and 100 meV. An increased bandgap can improve the voltage across the junction, with the semiconductor edge filter ensuring current matching can also be achieved, thereby improving the performance of the dilute nitride junction.

In other embodiments, the bandgap increase can be graded across the dilute nitride layer. The bandgap grading can be linear or it can be non-linear, such as a quadratic grade, across the dilute nitride layer or portion of the dilute nitride layer. For example, the UID layer may have no bandgap change, but the bandgap of the p-doped region can vary from zero bandgap increase at the interface with the UID region to a bandgap increase of up to 10 meV or 30 meV or 50 meV or 100 meV at the interface between the p-doped region and the back surface field of the dilute nitride junction. Stepped bandgap structures and graded bandgap structures can improve current collection by providing a field effect across the junction, thereby improving the performance of the dilute nitride junction.

In other embodiments, changes in the thickness of the layers, as described above can be combined with composition (and bandgap) changes, as described above.

Methods of fabricating a semiconductor device such as a dilute nitride-containing multijunction solar cell provided by the present disclosure can comprise providing a p-type semiconductor; forming a n-type region in the p-type semiconductor by exposing the p-type semiconductor to a gas phase n-type dopant to form a n-p junction; depositing a barrier layer over the n-type region; depositing an arsenic-containing layer over the barrier layer; and thermally annealing the semiconductor device at a temperature within a range from 600° C. to 900° C. for a duration from 5 seconds to 5 hours. Following the thermal annealing step, the semiconductor device retains the performance attributes as before the thermal treatment.

A plurality of layers can be deposited on a substrate in a first materials deposition chamber. The plurality of layers may include etch stop layers, release layers (i.e., layers designed to release the semiconductor layers from the substrate when a specific process sequence, such as chemical etching, is applied), contact layers such as lateral conduction layers, buffer layers, or other semiconductor layers. In one specific embodiment, the sequence of layers deposited is buffer layer(s), then release layer(s), and then lateral conduction or contact layer(s). Next the substrate is transferred to a second materials deposition chamber where one or more junctions are deposited on top of the existing semiconductor layers. The substrate may then be transferred to either the first materials deposition chamber or to a third materials deposition chamber for deposition of one or more junctions and then deposition of one or more contact layers. Tunnel junctions are also formed between the junctions.

The movement of the substrate and semiconductor layers from one materials deposition chamber to another is defined as the transfer. For example, a substrate is placed in a first materials deposition chamber, and then the buffer layer(s) and the bottom junction(s) are deposited. Then the substrate and semiconductor layers are transferred to a second materials deposition chamber where the remaining junctions are deposited. The transfer may occur in vacuum, at atmospheric pressure in air or another gaseous environment, or in any environment in between. The transfer may further be between materials deposition chambers in one location, which may or may not be interconnected, or may involve transporting the substrate and semiconductor layers between different locations, which is known as transport. Transport may be done with the substrate and semiconductor layers sealed under vacuum, surrounded by nitrogen or another gas, or surrounded by air. Additional semiconductor, insulating or other layers may be used as surface protection during transfer or transport, and removed after transfer or transport before further deposition.

Dilute nitride junctions can be deposited in a first materials deposition chamber, and the (Al,In)GaP and (Al,In)GaAs junctions can be deposited in a second materials deposition chamber, with tunnel junctions formed between the junctions. A transfer can occur in the middle of the growth of one junction, such that a junction has one or more layers deposited in one materials deposition chamber and one or more layers deposited in a second materials deposition chamber.

Some or all of the layers of a dilute nitride junction and the tunnel junctions can be deposited in one materials deposition chamber by molecular beam epitaxy (MBE), and the remaining layers of the photovoltaic cell are deposited by chemical vapor deposition (CVD) in another materials deposition chamber. For example, a substrate is placed in a first materials deposition chamber and layers that may include nucleation layers, buffer layers, emitter and window layers, contact layers and a tunnel junction are grown on the substrate, followed by one or more dilute nitride junctions. If there is more than one dilute nitride junction, then a tunnel junction is grown between adjacent junctions. One or more tunnel junction layers may be grown, and then the substrate is transferred to a second materials deposition chamber where the remaining photovoltaic cell layers are grown by chemical vapor deposition. In certain embodiments, the chemical vapor deposition system is a MOCVD system. In a related embodiment of the invention, a substrate is placed in a first materials deposition chamber and layers that may include nucleation layers, buffer layers, emitter and window layers, contact layers and a tunnel junction are grown on the substrate by chemical vapor deposition. Subsequently, the top junctions, two or more, are grown on the existing semiconductor layers, with tunnel junctions grown between the junctions. Part of the topmost dilute nitride junction, such as the window layer, may then be grown. The substrate is then transferred to a second materials deposition chamber where the remaining semiconductor layers of the topmost dilute nitride junction may be deposited, followed by up to three more dilute nitride junctions, with tunnel junctions between them.

In some embodiments, a surfactant, such as Sb or Bi, may be used when depositing any of the layers of the device. A small fraction of the surfactant may also incorporate within a layer.

A photovoltaic cell can be subjected to one or more thermal annealing treatments after growth. For example, a thermal annealing treatment includes the application of a temperature of 400° C. to 1000° C. for between 10 microseconds and 10 hours. Thermal annealing may be performed in an atmosphere that includes air, nitrogen, arsenic, arsine, phosphorus, phosphine, hydrogen, forming gas, oxygen, helium and any combination of the preceding materials. In certain embodiments, a stack of junctions and associated tunnel junctions may be annealed prior to fabrication of additional junctions.

Doping introduces an electric field in addition to the built-in electric field at the emitter-base junction of a junction. The minority carriers generated by the photovoltaic effect in the junction structure are affected by this additional electric field, influencing current collection. Positioning of a doping profile across a dilute nitride base layer can be designed to generate an additional electric field that pushes minority carries to the front of the junction, resulting in a high recombination velocity and substantial improvement in minority carrier collection. Dilute nitride junctions with improved performance characteristics can have graded doping, where the dopant concentration changes with the vertical axis of a junction. The doping profile may not be constant, but may be linear, exponential or have other dependence on position, causing different effects on the electric field. When dilute nitride junctions with graded doping are compared to conventional photovoltaic junctions with a wide, uniform region of intrinsic doping (i.e., undoped), for enhanced carrier collection (an accepted best practice for work with conventional semiconductor materials), graded doping dilute nitride junctions, and in particular exponentially doped dilute nitride junctions, exhibit superior performance characteristics. Position dependent-doping can also be applied to the emitter, further increasing current collection for the junction when used in conjunction with doping of the dilute nitride base.

Although the focus of this disclosure has been on linearly chirped reflectors for multi junction solar cells, other apps, designs, etc.

Aspects of the Invention

Aspect 1. A semiconductor edge filter, wherein the semiconductor edge filter is configured to provide: a reflectivity greater than 90% over a first wavelength range, and a full-width-half-maximum greater than 100 nm; and a transmissivity greater than 95% over a second wavelength range, wherein the second wavelength range is for wavelength longer than the first wavelength range and the second wavelength range is broader than 500 nm.

Aspect 2. A semiconductor structure comprising: a semiconductor edge filter; a first light absorbing region overlying the semiconductor edge filter having a first bandgap and a first absorption spectrum; and a second light absorbing region underlying the semiconductor edge filter having a second bandgap and a second absorption spectrum.

Aspect 3. A semiconductor structures of aspects 1 or 2 further comprising a first doped layer underlying the second light absorbing region; and a second doped layer overlying the first light absorbing region.

Aspect 4. The semiconductor structure of aspect 3, wherein the first doped layer is n-type doped and the second doped layer is p-type doped.

Aspect 5. The semiconductor structure of aspect 3, wherein the first doped layer is p-type doped and the second doped layer is n-type doped.

Aspect 6. The semiconductor structure of any one of aspects 2 to 5, wherein the semiconductor edge filter comprises a doping type that is the same as a doping type as the first doped layer.

Aspect 7. The semiconductor structure of any one of aspects 2 to 6, wherein the semiconductor edge filter comprises a plurality of layers, wherein adjacent layers of the plurality of layers are characterized by a different refractive index and a different thickness.

Aspect 8. The semiconductor structure of any one of aspects 1 to 7, wherein each of the layers comprises AlAs, AlGaAs, GaAs, InAs, GaInAs, AlInAs, InGaP, AlInGaP, InGaP, GaP, InP, AlP, AlInP, or AlInGaAs.

Aspect 9. The semiconductor structure of any one of aspects 2 to 8, wherein the semiconductor edge filter is configured to reflect light at wavelengths that can be absorbed by the first light absorbing region.

Aspect 10. The semiconductor structure of any one of aspects 2 to 9, wherein the semiconductor edge filter is configured to transmit light at wavelengths that can be absorbed by the second light absorbing region.

Aspect 11. The semiconductor structure of any one of aspects 2 to 10, wherein the first light absorbing region comprises a dilute nitride material.

Aspect 12. The semiconductor structure of any one of aspects 2 to 11 wherein the first light absorbing region comprises GaInNAsSb, GaInNAsBi, or GaInNAsSbBi.

Aspect 13. The semiconductor structure of any one of aspects 2 to 12, wherein the first light absorbing region is lattice matched to Ge or to GaAs.

Aspect 14. The semiconductor structure of any one of aspects 2 to 13, wherein the first light absorbing region comprises $Ga_{1-x}In_xN_yAs_{1-y-z}Sb_z$, where x, y and z fall within the ranges $0 \le x \le 0.4$, $0 < y \le 0.1$ and $0 < z \le 0.2$.

Aspect 15. The semiconductor structure of any one of aspects 2 to 14, wherein the first light absorbing region is characterized by a band gap within a range from 0.7 eV to 1.3 eV.

Aspect 16. The semiconductor structure of any one of aspects 2 to 15, wherein the second light absorbing region is characterized by a band gap smaller than the bandgap for the first light absorbing region.

Aspect 17. The semiconductor structure of any one of aspects 2 to 16, further comprising a graded interlayer between adjacent layers.

Aspect 18. The semiconductor structure of any one of aspects 2 to 16, wherein the semiconductor edge filter is characterized by a high-reflectivity long-wavelength cutoff within 25 nm of the absorption edge of the first light absorbing layer.

Aspect 18. The semiconductor structure of any one of aspects 2 to 17, wherein the semiconductor edge filter is characterized by a high-reflectivity long-wavelength cutoff within a range from 900 nm (1.378 eV) to 1,400 nm (0.885 eV), from 900 nm (1.378 eV) to 1,300 nm (0.954 eV), from 900 nm (1.378 eV) to 1,200 nm (1.033 eV), or from 1000 nm (1.240 eV) to 1,150 nm (1.078 eV).

Aspect 19. The semiconductor structure of any of aspects 1 to 18, wherein the semiconductor edge filter has at least 40 layers.

Aspect 20. A semiconductor device comprising the semiconductor structure of any one of aspects 2 to 19.

Aspect 21. A multijunction photovoltaic cell comprising the semiconductor structure of any one of aspects 2 to 19.

Aspect 22. A photovoltaic module comprising the multijunction photovoltaic cell of aspect 21.

Aspect 23. A power system comprising the photovoltaic module of aspect 22.

Aspect 1A. A semiconductor edge filter, wherein the semiconductor edge filter is configured to provide: a normal reflectivity greater than 90% over a first wavelength range, and a normal transmissivity greater than 95% over a second wavelength range.

Aspect 2A. The semiconductor edge filter of aspect 1A, wherein a full-width-half-maximum for the reflectivity of the first wavelength range is greater than 100 nm.

Aspect 3A. The semiconductor edger filter of aspect 2A, wherein the second wavelength range is at wavelengths longer than the first wavelength range and wherein the second wavelength range is greater than 500 nm.

Aspect 4A. The semiconductor edge filter of any one of aspects 1A to 3A, wherein the semiconductor edge filter comprises a plurality of layers, wherein adjacent layers of the plurality of layers are characterized by a different refractive index and a different thickness.

Aspect 5A. The semiconductor edge filter of aspect 4A, wherein the optical thicknesses for the different layers are not periodic and do not vary monotonically.

Aspect 6A. A semiconductor structure comprising: a semiconductor edge filter; a first light absorbing region overlying the semiconductor edge filter having a first bandgap and a first absorption spectrum; and a second light absorbing region underlying the semiconductor edge filter having a second bandgap and a second absorption spectrum.

Aspect 7A. The semiconductor structure of aspect 6A, further comprising: a first doped layer underlying the second light absorbing region; and a second doped layer overlying the first light absorbing region.

Aspect 8A. The semiconductor structure of any one of aspects 6A to 7A, wherein the semiconductor edge filter is configured to reflect light at wavelengths that can be absorbed by the first light absorbing region.

Aspect 9A. The semiconductor structure of any one of aspects 6A to 8A, wherein the semiconductor edge filter is configured to transmit light at wavelengths that can be absorbed by the second light absorbing region.

Aspect 10A. The semiconductor structure of any one of aspects 6A to 9A, wherein the first light absorbing region is characterized by a band gap within a range from 0.7 eV to 1.3 eV.

Aspect 11A. The semiconductor structure of any one of aspects 6A to 10A, wherein the second light absorbing region is characterized by a band gap smaller than the bandgap for the first light absorbing region.

Aspect 12A. The semiconductor structure of any one of aspects 6A to 11A, wherein the semiconductor edge filter is characterized by a high-reflectivity long-wavelength cutoff within 25 nm of the absorption edge of the first light absorbing layer.

Aspect 13A. The semiconductor structure of aspect 9A, wherein the semiconductor edge filter is characterized by a high-reflectivity long-wavelength cutoff within a range from 900 nm (1.378 eV) to 1,400 nm (0.885 eV), from 900 nm (1.378 eV) to 1,300 nm (0.954 eV), from 900 nm (1.378 eV) to 1,200 nm (1.033 eV), or from 1000 nm (1.240 eV) to 1,150 nm (1.078 eV).

Aspect 14A. The semiconductor structure of any one of aspects 6A to 13A, wherein the first light absorbing region is lattice matched to Ge or to GaAs.

Aspect 15A. The semiconductor structure of any one of aspects 6A to 14A, wherein the first light absorbing region comprises a dilute nitride material.

Aspect 16A. The semiconductor structure of aspect 15A, wherein the first light absorbing region comprises GaInNAsSb, GaInNAsBi, or GaInNAsSbBi.

Aspect 17A. The semiconductor structure of any one of aspects 15A to 16A, wherein the first light absorbing region comprises $Ga_{1-x}In_xN_yAs_{1-y-z}Sb_z$, where x, y and z fall within the ranges $0 \leq x \leq 0.4$, $0 < y \leq 0.1$ and $0 < z \leq 0.2$.

Aspect 18A. A semiconductor device comprising the semiconductor structure of any one of aspects 6A to 17A.

Aspect 19A. A multijunction photovoltaic cell comprising the semiconductor structure of any one of aspects 6A to 17A.

Aspect 20A. A photovoltaic module comprising the multijunction photovoltaic cell of aspect 19A.

Aspect 21A. A power system comprising the photovoltaic module of aspect 20A.

It should be noted that there are alternative ways of implementing the embodiments disclosed herein. Accordingly, the present embodiments are to be considered as illustrative and not restrictive. Furthermore, the claims are not to be limited to the details given herein and are entitled their full scope and equivalents thereof.

What is claimed is:
1. A semiconductor structure comprising:
a semiconductor edge filter comprising a plurality of layers, wherein: each layer of the plurality of layers has a non-periodic optical thickness, a plurality of layer pairs are formed by the plurality of layers, the optical thickness of each layer pair of the plurality of layer pairs is different from the optical thickness of its adjacent layer pairs of the plurality of layer pairs, and adjacent layers of each layer pair of the plurality of layer pairs are characterized by a different refractive index;

a first light absorbing region overlying the semiconductor edge filter having a first bandgap and a first absorption spectrum; and a second light absorbing region underlying the semiconductor edge filter having a second bandgap and a second absorption spectrum.

2. The semiconductor structure of claim 1, wherein the semiconductor edge filter is configured to reflect light at wavelengths that can be absorbed by the first light absorbing region.

3. The semiconductor structure of claim 1, wherein the semiconductor edge filter is configured to transmit light at wavelengths that can be absorbed by the second light absorbing region.

4. The semiconductor structure of claim 1, wherein the first light absorbing region is characterized by a band gap within a range from 0.7 eV to 1.3 eV.

5. The semiconductor structure of claim 1, wherein the second light absorbing region is characterized by a band gap smaller than the bandgap for the first light absorbing region.

6. The semiconductor structure of claim 1, wherein the semiconductor edge filter is characterized by a long-wavelength cutoff within 25 nm of the absorption edge of the first light absorbing layer.

7. The semiconductor structure of claim 1, wherein the semiconductor edge filter is characterized by a long-wavelength cutoff within a range from 900 nm (1.378 eV) to 1,400 nm (0.885 eV), from 900 nm (1.378 eV) to 1,300 nm (0.954 eV), from 900 nm (1.378 eV) to 1,200 nm (1.033 eV), or from 1000 nm (1.240 eV) to 1,150 nm (1.078 eV).

8. The semiconductor structure of claim 1, wherein the first light absorbing region is lattice matched to Ge or to GaAs.

9. The semiconductor structure of claim 1, wherein the first light absorbing region comprises a dilute nitride material.

10. The semiconductor structure of claim 9, wherein the first light absorbing region comprises GaInNAsSb, GaInNAsBi, or GaInNAsSbBi.

11. The semiconductor structure of claim 9, wherein the first light absorbing region comprises $Ga_{1-x}In_xN_yAS_{1-y-z}Sb_z$, where x, y and z fall within the ranges $0 \leq x \leq 0.4$, $0 < y \leq 0.1$ and $0 < z \leq 0.2$.

12. The semiconductor structure of claim 1, wherein the semiconductor edge filter is configured to provide a normal reflectivity greater than 90% over a first wavelength range, and a normal transmissivity greater than 95% over a second wavelength range.

13. The semiconductor structure of claim 12, wherein a full-width-half-maximum for the reflectivity of the first wavelength range is greater than 100 nm.

14. The semiconductor structure of claim 13, wherein the second wavelength range is at wavelengths longer than the first wavelength range and wherein the second wavelength range is greater than 500 nm.

15. The semiconductor structure of claim 1, wherein each layer has a different non-periodic optical thickness between about 5 nm and 1,300 nm, or between about 10 nm and 1,000 nm, or between about 5 nm and 250 nm.

16. The semiconductor structure of claim 1, wherein the semiconductor edge filter comprises from 40 to 200 layers forming from 20 to 100 layer pairs.

* * * * *